US011693100B2

(12) United States Patent
Kubota et al.

(10) Patent No.: US 11,693,100 B2
(45) Date of Patent: Jul. 4, 2023

(54) LIGHT DETECTOR AND DISTANCE MEASURING DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroshi Kubota, Tokyo (JP); Nobu Matsumoto, Ebina Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 470 days.

(21) Appl. No.: 17/016,926

(22) Filed: Sep. 10, 2020

(65) Prior Publication Data
US 2021/0302551 A1    Sep. 30, 2021

(30) Foreign Application Priority Data

Mar. 24, 2020    (JP) ................................ 2020-053221

(51) Int. Cl.
*G01S 7/48*    (2006.01)
*G01S 7/4865*    (2020.01)
(Continued)

(52) U.S. Cl.
CPC ......... *G01S 7/4865* (2013.01); *G01S 7/4863* (2013.01); *G01S 17/10* (2013.01); *H01L 31/02027* (2013.01)

(58) Field of Classification Search
USPC ...................................................... 356/4.01
See application file for complete search history.

(56) References Cited

U.S. PATENT DOCUMENTS 10,473,769 B2 * 11/2019 Shinozuka ............ G01S 7/4865
11,131,756 B2 *  9/2021 Slobodyanyuk ...... G01S 7/4865
(Continued)

FOREIGN PATENT DOCUMENTS

JP    2018-151197 A    9/2018
JP    2018-528437 A    9/2018
(Continued)

OTHER PUBLICATIONS

Zappa, F. et al. "Fully-Integrated Active-Quenching Circuit for Single-Photon Detection," Proceedings of the 28th European Solid State Circuit Conference, ESSCIRC'02, Florence, Italy, Sep. 24-26, 2002, pp. 355-358.

*Primary Examiner* — James R Hulka
(74) *Attorney, Agent, or Firm* — Kim & Stewart LLP

(57) ABSTRACT

A light detector according to an embodiment includes a light receiver and a controller. The controller is configured to set first and second light-receiving regions. The first light-receiving region includes first and second pixel regions. The second light-receiving region includes a third pixel region. An area of the third pixel region is larger than a total area of the first and second pixel regions. The light receiver is configured to, when light is applied: cause each of the first and second pixel regions within the first light-receiving region to individually output a signal; and cause the third pixel region within the second light-receiving region to output signals collectively.

14 Claims, 17 Drawing Sheets

(51) Int. Cl.
*G01S 17/10* (2020.01)
*G01S 7/4863* (2020.01)
*H01L 31/02* (2006.01)

(56) References Cited

U.S. PATENT DOCUMENTS

| | | | |
|---|---|---|---|
| 11,204,420 B2* | 12/2021 | Kubota | G01S 7/4865 |
| 2011/0221919 A1* | 9/2011 | Zhang | G06F 3/0416 |
| | | | 348/222.1 |
| 2012/0249998 A1* | 10/2012 | Eisele | G01S 7/4816 |
| | | | 356/5.01 |
| 2014/0071433 A1* | 3/2014 | Eisele | G01S 7/4914 |
| | | | 356/5.01 |
| 2016/0126304 A1* | 5/2016 | Cho | H01L 51/5228 |
| | | | 438/23 |
| 2016/0135689 A1* | 5/2016 | Murakoshi | A61B 5/0095 |
| | | | 600/407 |
| 2016/0231547 A1* | 8/2016 | Kubo | G02B 21/361 |
| 2017/0003121 A1* | 1/2017 | Brandli | G01B 11/25 |
| 2017/0046843 A1* | 2/2017 | Liu | G06F 3/0425 |
| 2017/0090019 A1 | 3/2017 | Slobodyanyuk et al. | |
| 2018/0081040 A1* | 3/2018 | Kubota | G01S 7/4865 |
| 2018/0165512 A1* | 6/2018 | Fan | G06V 10/145 |
| 2018/0259627 A1 | 9/2018 | Shinozuka et al. | |
| 2019/0086541 A1 | 3/2019 | Kubota et al. | |
| 2020/0025883 A1* | 1/2020 | Stann | G01S 7/4814 |
| 2020/0284883 A1* | 9/2020 | Ferreira | G01S 17/10 |
| 2020/0292670 A1* | 9/2020 | Kubota | H01L 31/107 |
| 2020/0300985 A1 | 9/2020 | Kubota et al. | |

FOREIGN PATENT DOCUMENTS

| | | |
|---|---|---|
| JP | 2019-56567 A | 4/2019 |
| JP | 2020-153746 A | 9/2020 |

* cited by examiner

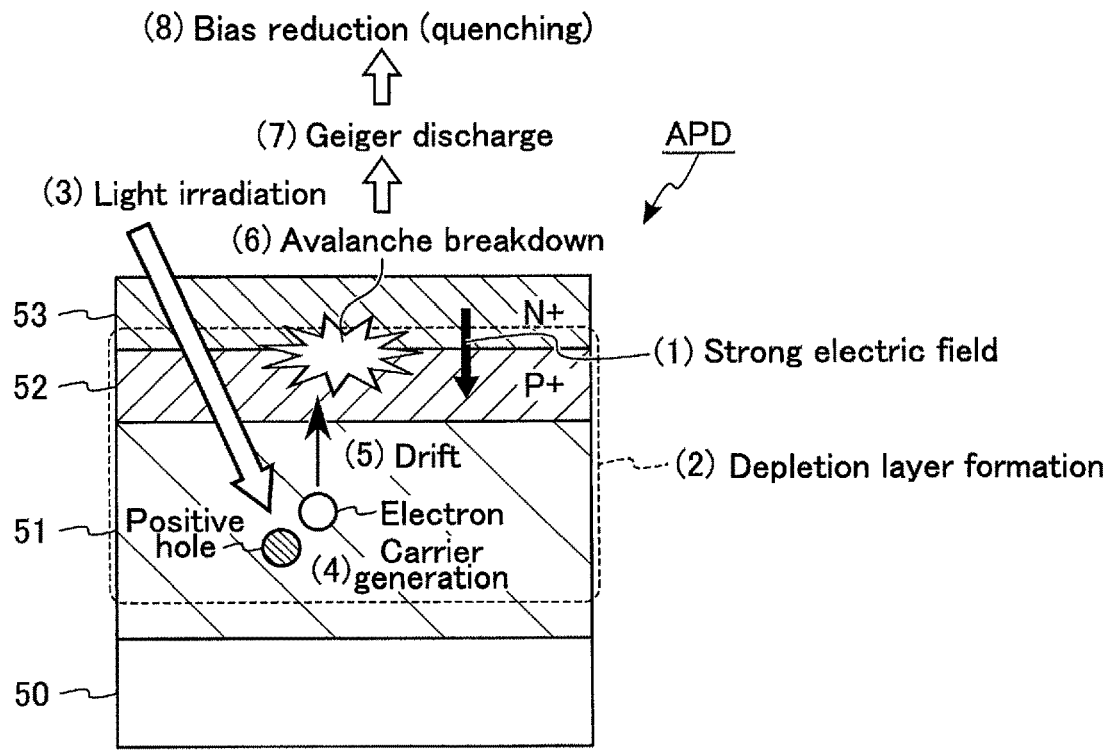
F I G. 4
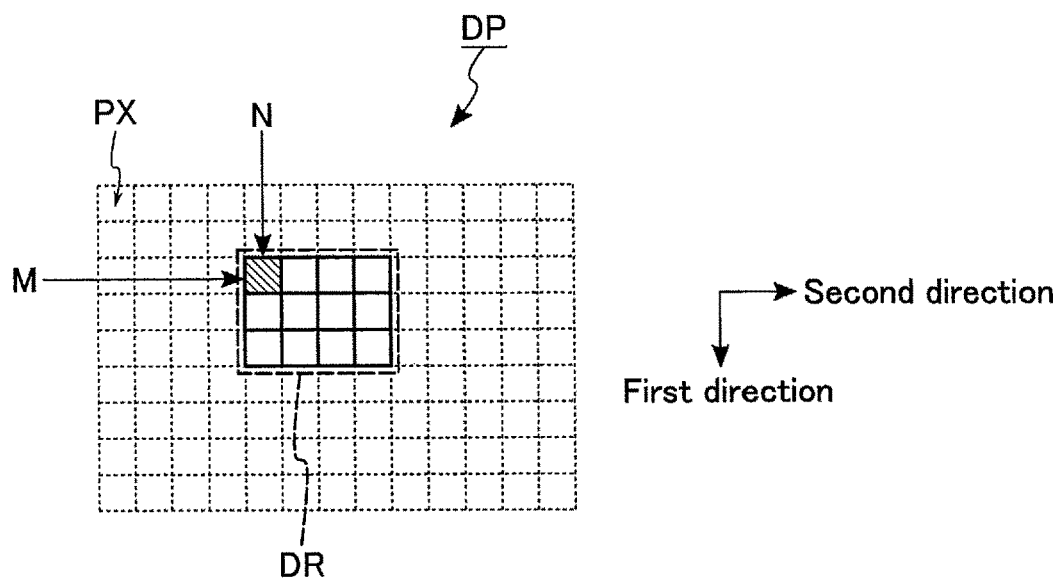
F I G. 5

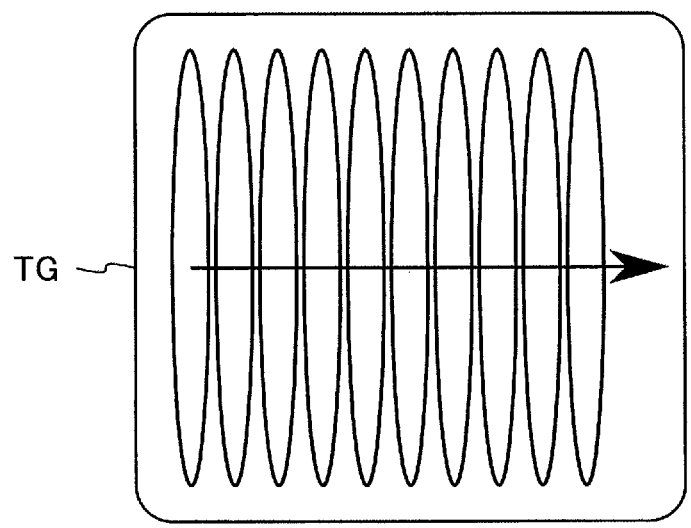
F I G. 11
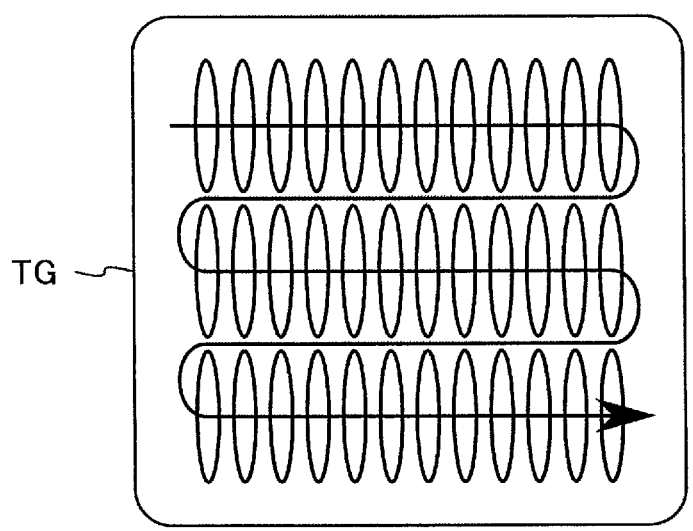
F I G. 12

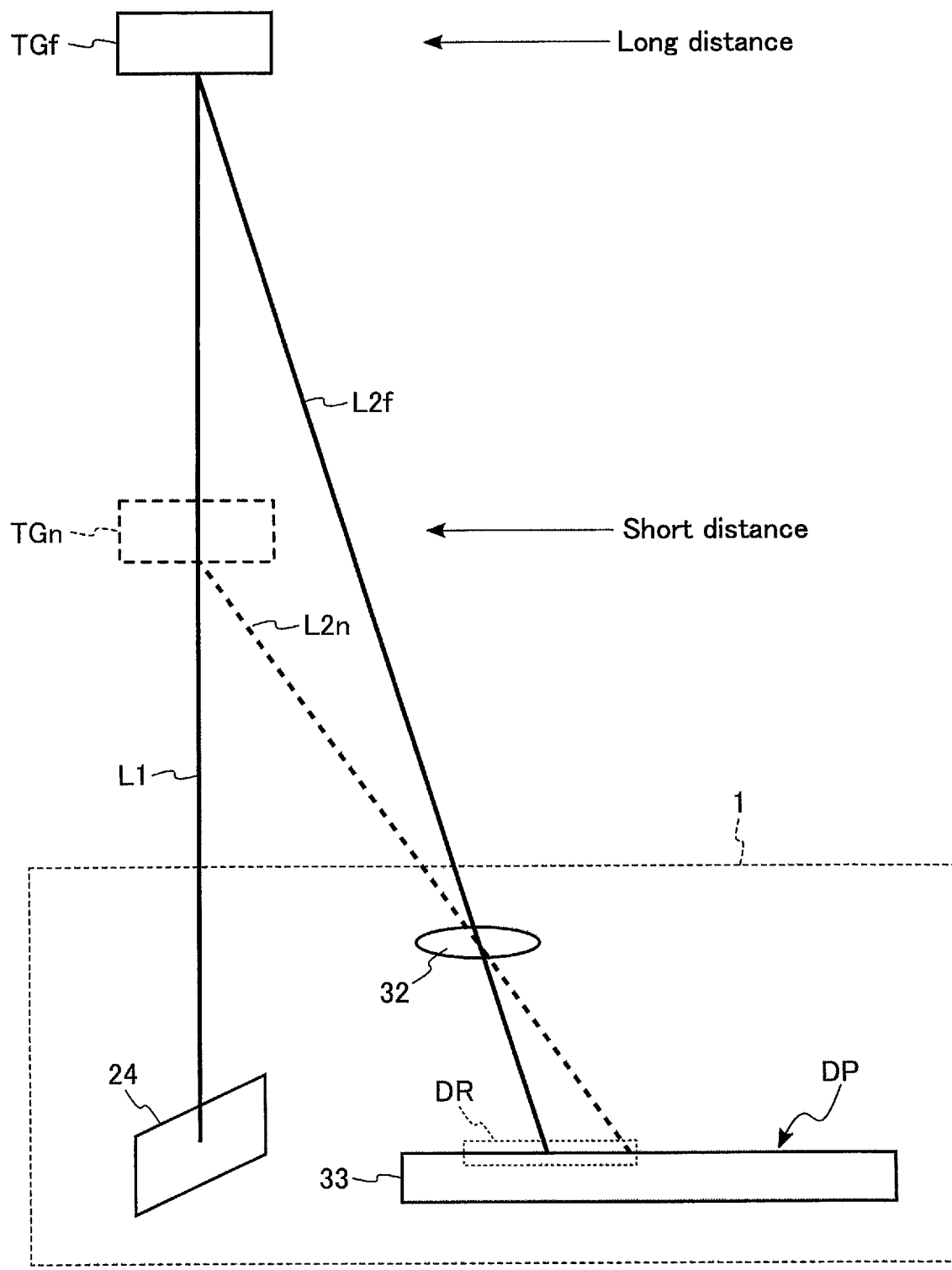
F I G. 13

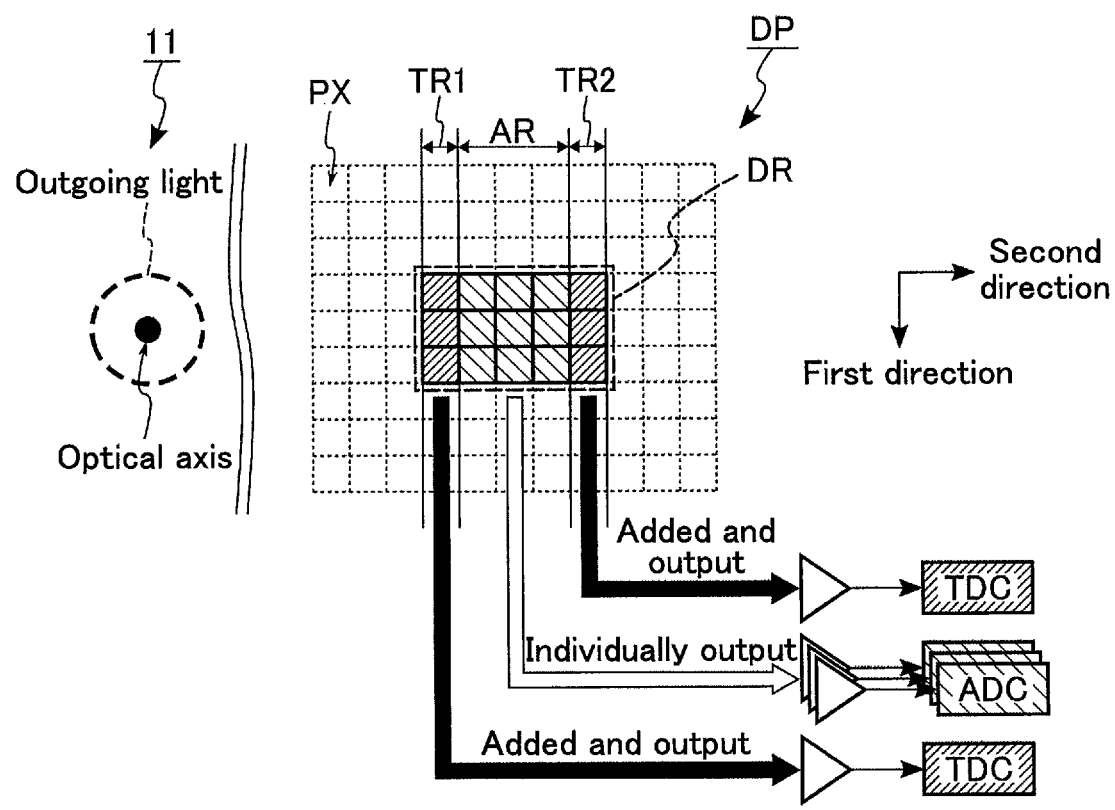
F I G. 14

Waveform of outgoing signal (outgoing light)

Received light waveform in region AR

Received light waveform in region TR

Waveform of outgoing signal (outgoing light)

Received light waveform in region AR

Received light waveform in region TR

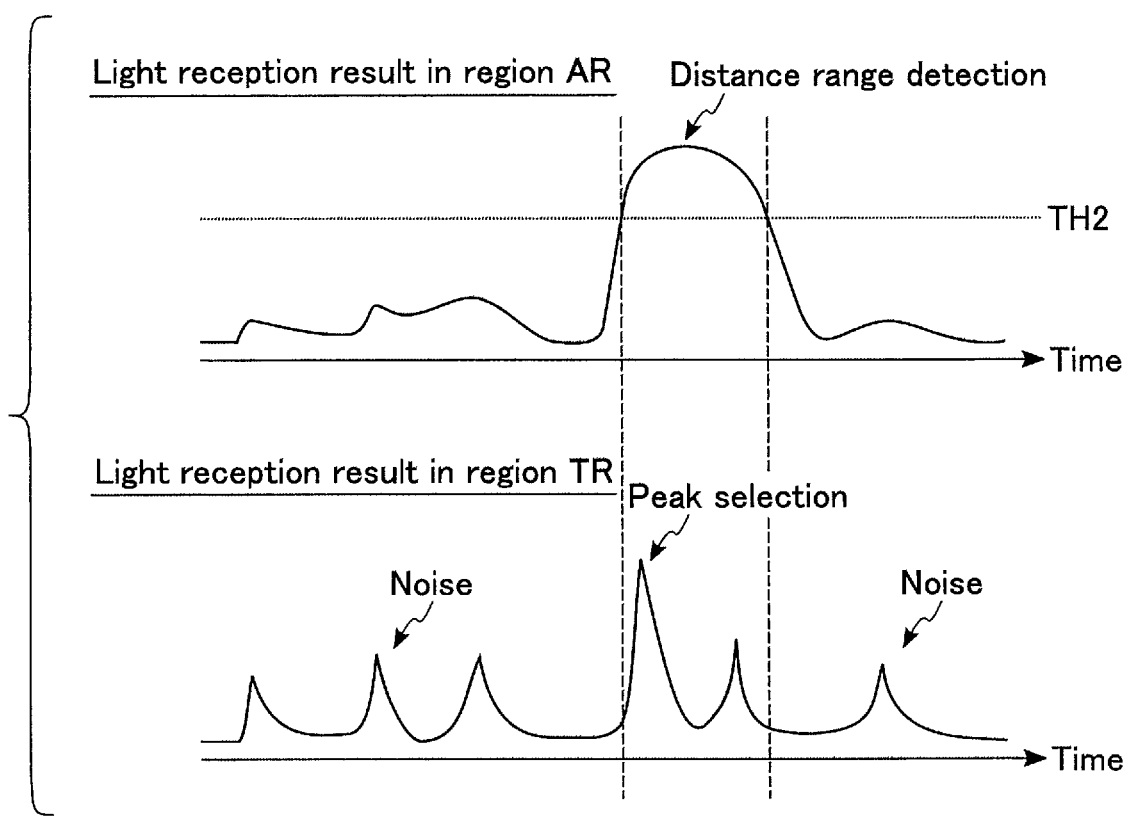
F I G. 18

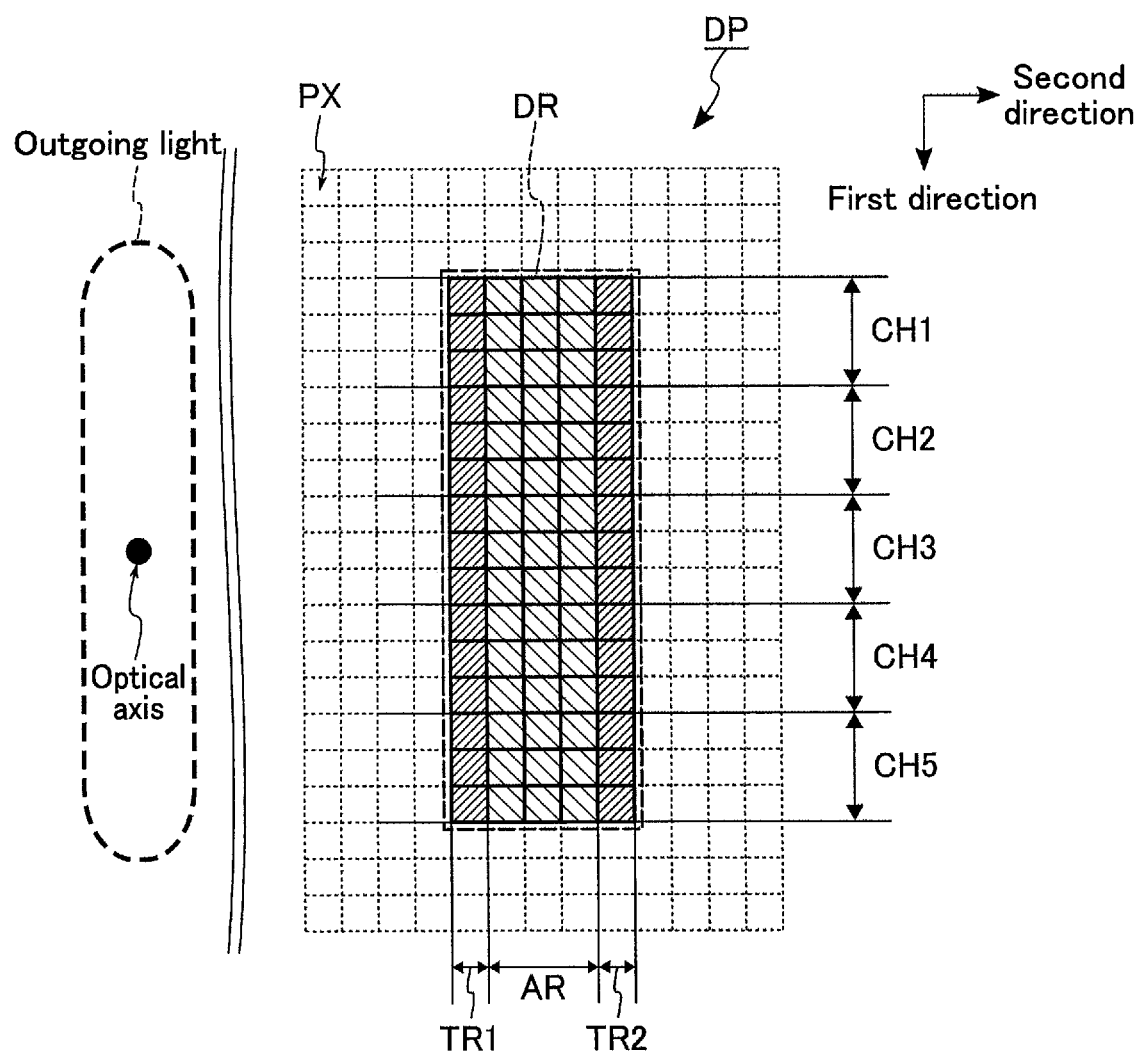
F I G. 19

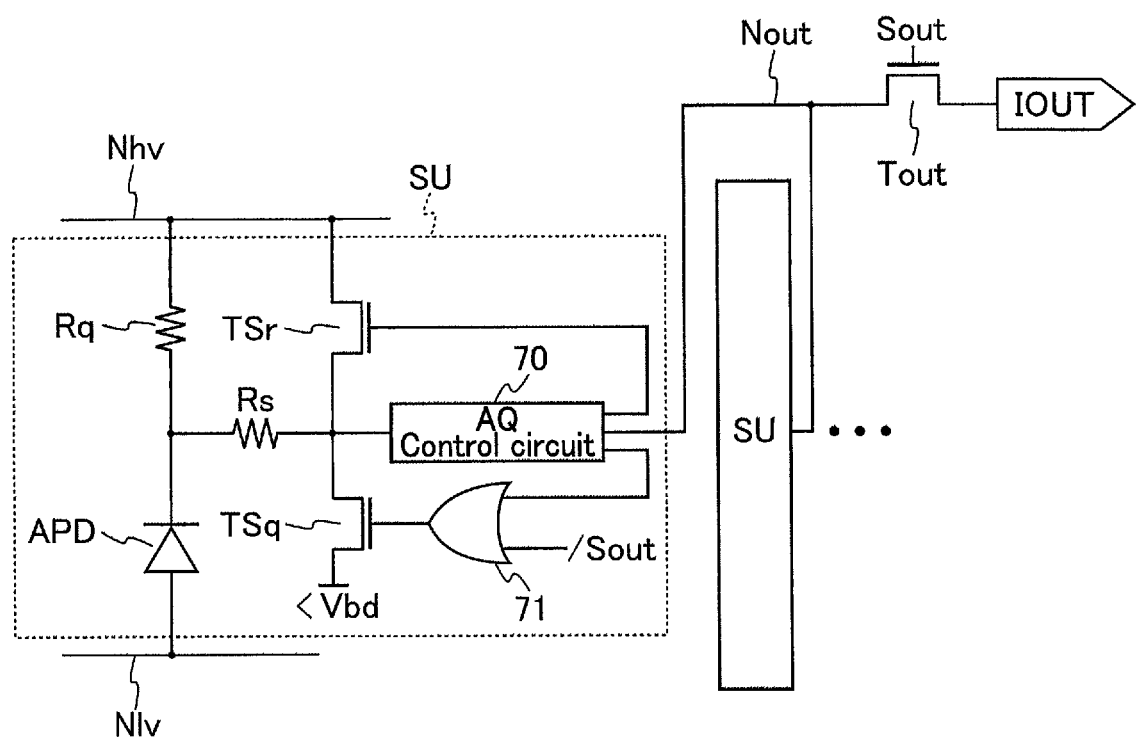
F I G. 20

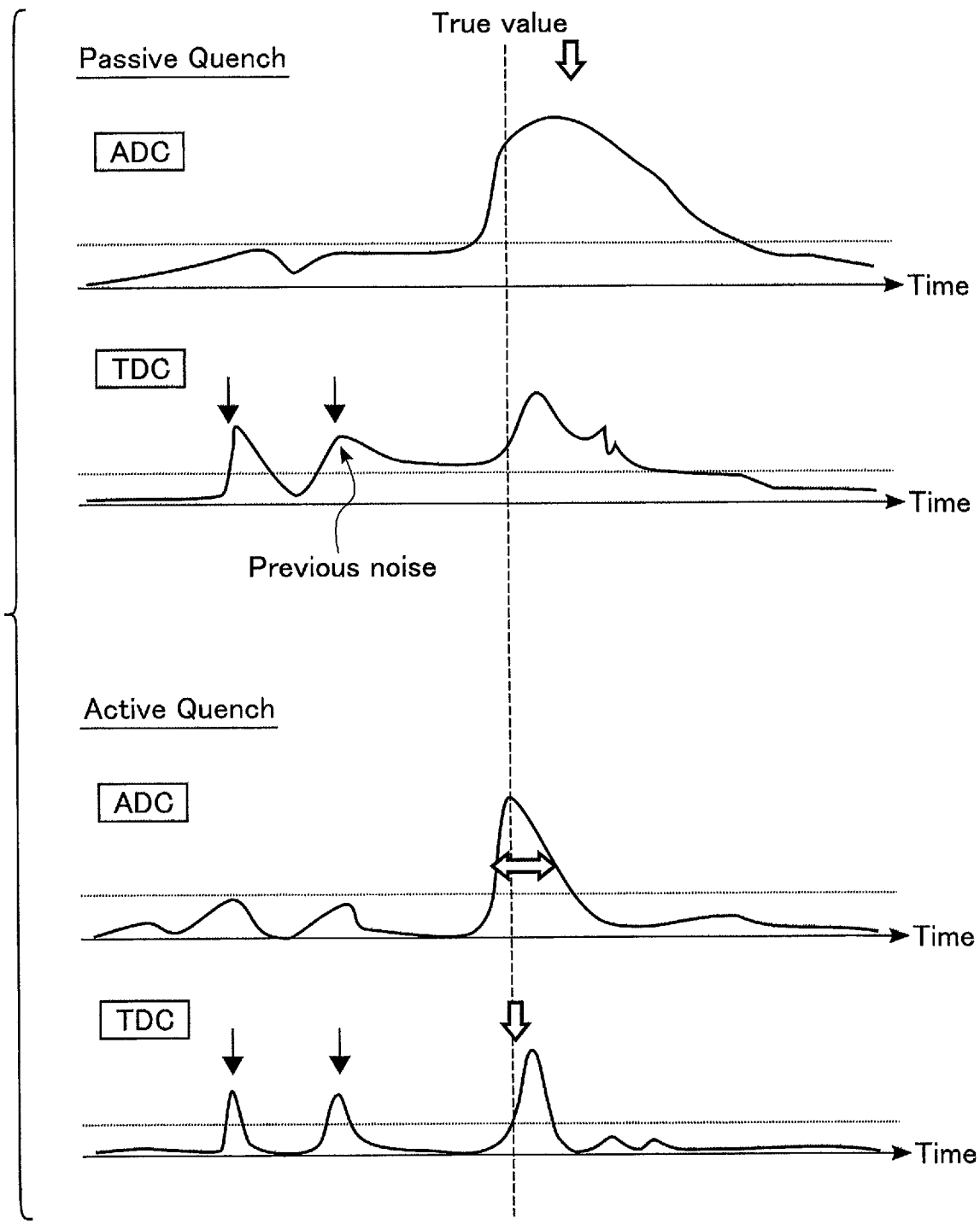
F I G. 21

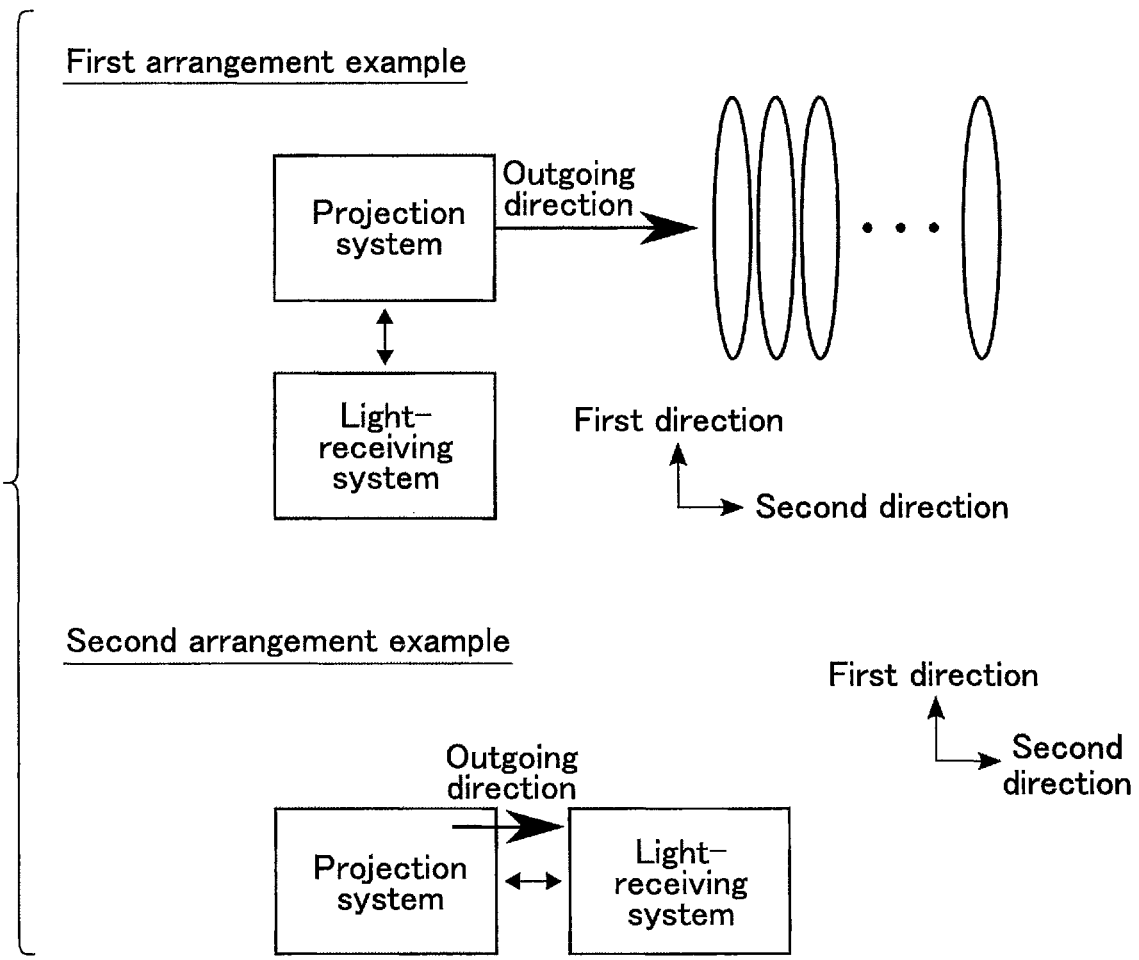
F I G. 23

LIGHT DETECTOR AND DISTANCE MEASURING DEVICE

CROSS-REFERENCE TO RELATED APPLICATIONS

This application is based upon and claims the benefit of priority from Japanese Patent Application No. 2020-053221, filed Mar. 24, 2020, the entire contents of which are incorporated herein by reference.

FIELD

Embodiments described herein relate generally to a light detector and a distance measuring device.

BACKGROUND

A distance measuring device called "LiDAR (Light Detection and Ranging)" is known. A LiDAR irradiates a target object with laser light, and detects the intensity of reflected light reflected from the target object by a sensor (light detector). Then, the LiDAR measures a distance from itself to the target object based on a light intensity signal output from the sensor. There are a number of sensors used in the LiDAR, but a two-dimensional sensor (2D sensor) comprising a plurality of silicon photomultipliers arrayed two dimensionally is known to be a promising sensor for the future.

BRIEF DESCRIPTION OF THE DRAWINGS

FIG. 4 depicts a schematic diagram showing an example of a structure of an avalanche photodiode and an operation principle of the SPAD.

FIG. 5 depicts a plan view showing an example of a setting method of a light-receiving region in a light receiver included in the light detector according to the first embodiment.

FIG. 11 depicts a schematic diagram showing an example of a scanning method of laser light in the distance measuring device according to the first embodiment.

FIG. 12 depicts a schematic diagram showing an example of a scanning method of laser light in the distance measuring device according to the first embodiment.

FIG. 13 depicts a schematic diagram showing an example of change in reflected light in a distance measuring device of a non-coaxial optical system.

FIG. 14 depicts a plan view showing an example of a setting method of a light-receiving region of the light detector in a distance measurement operation of the distance measuring device according to the first embodiment.

FIG. 18 depicts a light intensity distribution diagram showing another example of an analyzing method of a measurement result in a case where a short-distance target object is detected in the distance measurement operation of the distance measuring device according to the first embodiment.

FIG. 19 depicts a plan view showing an example of a setting method of a light-receiving region of a light detector in a distance measurement operation of a distance measuring device according to a second embodiment.

FIG. 20 depicts a circuit diagram showing an example of a circuit configuration of a SPAD unit included in a light detector according to a third embodiment.

FIG. 21 depicts a light intensity distribution diagram showing an example of a measurement result in a case where a target object is detected in a distance measurement operation of a distance measuring device according to the third embodiment.

FIG. 23 depicts a schematic diagram showing an example of arrangement of a light emitter system and a light-receiving system in a distance measuring device according to a modification of the first embodiment.

DETAILED DESCRIPTION

Figure 1:
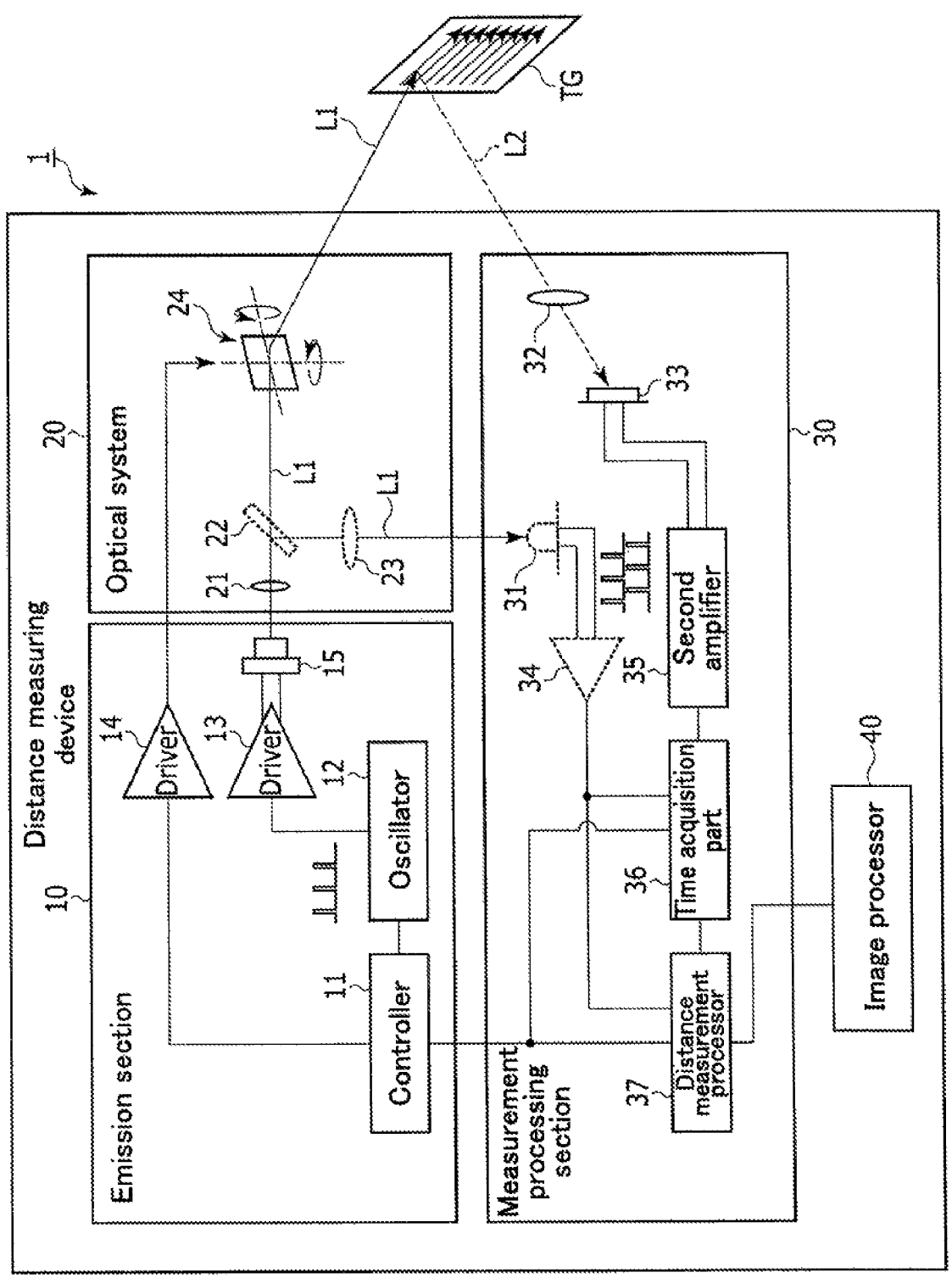
FIG. 1 depicts a schematic diagram showing an example of an overall configuration of a distance measuring device according to a first embodiment.

In general, according to one embodiment, a light detector includes a light receiver and a controller. The light receiver includes a plurality of sensors arranged two dimensionally on a substrate. The controller is configured to set a light-receiving region in which the sensors are selectively turned on in the light receiver. The controller is configured to set a first light-receiving region and a second light-receiving region different from the first light-receiving region based on information on coordinates input from outside. The first light-receiving region includes a first pixel region and a second pixel region, each of the first pixel region and the second pixel region including at least one of the sensors. The second light-receiving region includes a third pixel region.

An area of the third pixel region is larger than a total area of the first pixel region and the second pixel region. The light receiver is configured to, when light is applied: cause each of the first pixel region and the second pixel region within the first light-receiving region to individually output a signal; and cause the third pixel region within the second light-receiving region to output signals collectively.

Embodiments will be described below with reference to the accompanying drawings. Each embodiment exemplifies a device and a method for embodying a technical idea of the invention. The drawings are schematic or conceptual, and the dimensions and ratios, etc. in the drawings are not always the same as the actual ones. The technical idea of the present invention is not restricted by the shapes, structures, arrangements, etc., of the structural elements. In the following descriptions, structural elements having substantially the same function and configuration will be denoted by the same reference symbol. The numbers after the letters that make up the reference signs are used to distinguish between elements that are referenced by reference signs that contain the same characters and that have a similar construction.

[1] First Embodiment

A distance measuring device 1 according to a first embodiment is, for example, a type of LiDAR (Light Detection and Ranging) capable of measuring a distance between the distance measuring device 1 and a target object. The distance measuring device 1 according to the first embodiment will be described below. Note that a "target object TG" in the present specification refers to an object included in a range in which the distance measuring device 1 measures distance.

[1-1] Configuration

[1-1-1] Configuration of Distance Measuring Device 1

FIG. 1 depicts an example of an overall configuration of the distance measuring device 1 according to the first embodiment. As shown in FIG. 1, the distance measuring device 1 according to the first embodiment includes, for example, an emission section 10, an optical system 20, a measurement processing section 30, and an image processor 40.

The emission section 10 generates and emits laser light for use by the distance measuring device 1 to measure a distance between itself and a target object TG. The emission section 10 includes, for example, a controller 11, an oscillator 12, a first driver 13, a second driver 14, and a light source 15. Note that the controller 11 may be divided into an emission controller for controlling the emission section and a light-receiving controller for the measurement processing section (light-receiving section). If this is the case, the emission controller will be included in the emission section 10, and the light-receiving controller will be included in the measurement processing section (light-receiving section) 30.

The controller 11 controls an overall operation of the distance measuring device 1. The controller 11 includes, for example, a central processing unit (CPU), a read only memory (ROM), a random access memory (RAM), etc. The ROM in the controller 11, for example, stores a program used for an operation of the distance measuring device 1. The CPU of the controller 11 controls, for example, the oscillator 12, and the first driver 13 and second driver 14, according to the program stored in the ROM.

The oscillator 12 generates a pulse signal based on control by the controller 11. Then, the oscillator 12 outputs the generated pulse signal to the first driver 13. A timing at which the pulse signal rises corresponds to a timing at which the emission section 10 emits laser light.

The first driver 13 generates a drive current according to the pulse signal input from the oscillator 12, and supplies the generated drive current to the light source 15. That is, the first driver 13 functions as a current supply source of the light source 15.

The second driver 14 generates a drive current according to control by the controller 11, and supplies the generated drive current to a mirror 24 of the optical system 20. That is, the second driver 14 functions as a power supply circuit of the mirror 24.

The light source 15 is a laser light source, such as a laser diode. The light source 15 emits laser light L1 intermittently based on the drive current supplied from the first driver 13. The laser light L1 is applied to the target object TG through the optical system 20 to be described later.

The optical system 20 splits the incident laser light L1 in two. Then, the optical system 20 emits one of the laser light L1 split in two to the target object TG, and emits the other one to the light detector 31 of the measurement processing section 30. The optical system 20 includes, for example, a lens 21, an optical element 22, a lens 23, and the mirror 24.

The lens 21 is arranged on an optical path of the laser light L1 emitted from the light source 15. The lens 21 collimates the laser light L1 passing through the lens 21, and guides the collimated laser light L1 to the optical element 22.

The optical element 22 splits the laser light L1 guided by the lens 21 in two. The beams of the laser light L1 split in two are respectively emitted toward the lens 23 and mirror 24. The optical element 22 is, for example, a beam splitter.

The lens 23 is arranged on an optical path of one of the laser lights L1 split by the optical element 22. The lens 23 collects the laser light L1 passing through the lens 23, and guides the collected laser light L1 to the light detector 31 of the measurement processing section 30. That is, the lens 23 collects part of the laser light L1 before being emitted outside by the distance measuring device 1 in the light detector 31.

The mirror 24 reflects the laser light L1 incident thereon. The mirror 24 is driven based on the drive current supplied from the second driver 14. For example, a reflecting surface of the mirror 24 is formed to be rotatable around two axes intersecting each other. The laser light L1 reflected from the mirror 24 is emitted to the target object TG outside the distance measuring device 1.

The measurement processing section 30 measures a distance between the distance measuring device 1 and the target object TG based on the laser light L1 guided from the optical system 20 and reflected light L2 reflected from the target object TG. The measurement processing section 30 includes, for example, the light detector 31, a lens 32, a light detector 33, a first amplifier 34, a second amplifier 35, a time acquisition part 36, and a distance measurement processor 37.

The light detector 31 receives the laser light L1 incident thereon through the lens 23. Then, the light detector 31 outputs an electric signal based on the light intensity of the received laser light L1 to the first amplifier 34. The light detector 31 is, for example, a photodiode.

The lens 32 collects the reflected light L2 reflected from the target object TG, and guides the collected reflected light L2 to the light detector 33. That is, the lens 32 collects the outside light including the laser light L2 applied to the distance measuring device 1, in the light detector 33.

The light detector 33 receives the reflected light L2 incident thereon through the lens 32. Then, the light detector 33 outputs an electric signal based on the light intensity of the received reflected light L2 to the second amplifier 35, for example. The light detector 33 may include a photomultiplier element using a semiconductor. Details of the light detector 33 will be described later.

The first amplifier 34 amplifies the electric signal input from the light detector 31, and outputs the amplified electric signal to each of the time acquisition part 36 and the distance measurement processor 37. Hereinafter, the electric signal output by the first amplifier 34 may be referred to as a reference signal.

The second amplifier 35 amplifies the electric signal input from the light detector 33, and outputs the amplified electric signal to each of the time acquisition part 36 and the distance measurement processor 37. The second amplifier 35 is, for example, a transimpedance amplifier. Hereinafter, the electric signal output by the second amplifier 35 may be referred to as a measurement signal.

The time acquisition part 36 acquires a first time corresponding to a timing at which the emission section 10 emits the laser light L1 based on the signal strength of the reference signal input from the first amplifier 34. In addition, the time acquisition part 36 acquires a second time at which the light detector 33 receives the reflected light L2 reflected from the target object TG based on the signal strength of the measurement signal input from the second amplifier 35. Note that a set of the first time and second time is acquired for each reference signal emitted intermittently. The time acquisition part 36 may decide each time based on a rise time of a reference signal or measurement signal, or based on a peak time of a reference signal or measurement signal.

The distance measurement processor 37 measures a distance between the distance measuring device 1 and the target object TG based on a time difference between the first time and the second time acquired by the time acquisition part 36. That is, the distance measurement processor 37 calculates times of flight of the laser lights L1 and L2 based on an emission timing of the laser light L1 by the emission section 10 and an incident timing of the reflected light L2 reflected from the target object TG to the light detector 33. Then, the distance measurement processor 37 measures the distance between the distance measuring device 1 and the target object TG based on the times of flight and the speed of the laser lights. Such a distance measuring method may be called a "ToF (Time of Flight) method".

The image processor 40 acquires a measurement result of the distance between the distance measuring device 1 and the target object TG measured by the distance measurement processor 37. Then, the image processor 40 uses a plurality of acquired measurement results to generate images including distance information in a measurement-target region of the distance measuring device 1. The generated image is, for example, referred to by a control program of a vehicle, etc. equipped with the distance measuring device 1.

As described above, the distance measuring device 1 according to the first embodiment has a non-coaxial optical system in which the optical axis of the laser light L1 emitted from the emission section 10 and that of the reflected light L2 received by the light detector 33 are different. The configuration of the distance measuring device 1 according to the first embodiment is not limited to the above-described configuration. The configuration of the distance measuring device 1 according to the first embodiment may be other configurations as long as operations to be described later are executable.

For example, the optical element 22, lens 23, light detector 31, and first amplifier 34 may be omitted. If this is the case, instead of these configurations, the oscillator 12 may output a reference signal to the measurement processing section 30. In addition, the processing by the image processor 40 may be performed by an external device connected to the distance measuring device 1.

[1-1-2] Configuration of Light Detector 33

Figure 2:
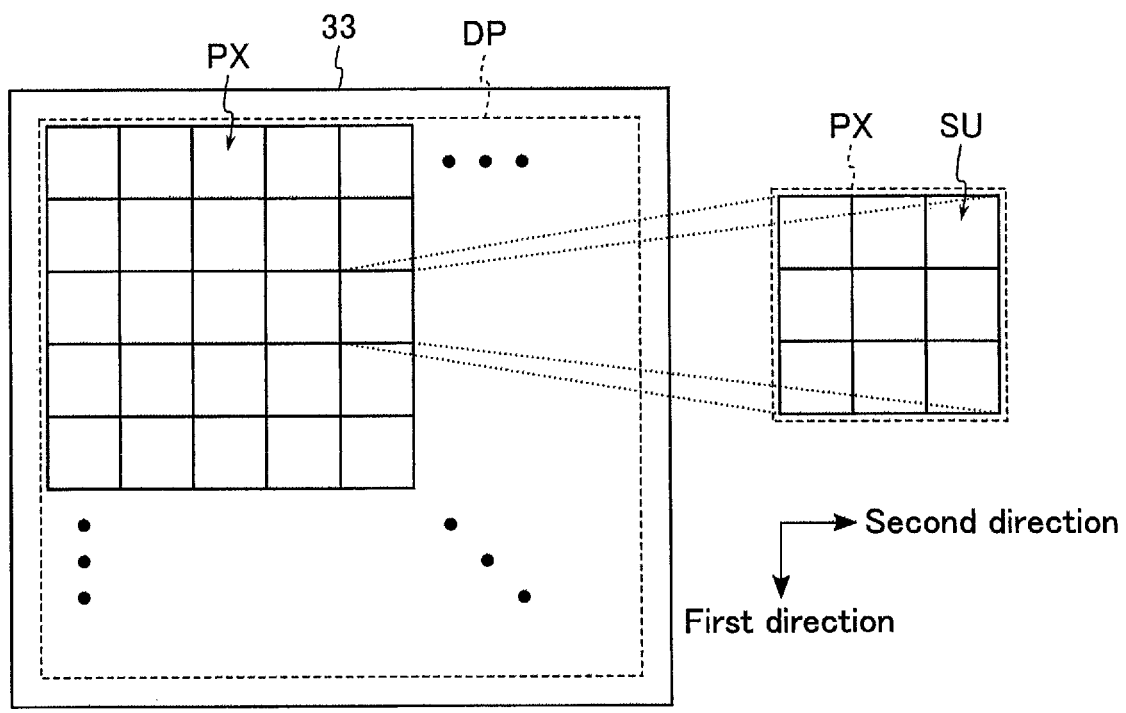
FIG. 2 depicts a plan view showing an example of a planar layout of a light detector according to the first embodiment.

FIG. 2 depicts an example of a planar layout of the light detector 33 according to the first embodiment. As shown in FIG. 2, the light detector 33 includes a light receiver DP. In the drawings to be referred to below, a "first direction" and a "second direction" correspond to directions intersecting each other.

The light receiver DP is, for example, a region for the light detector 33 to receive the reflected light L2 reflected from the target object TG. The light detector 33 includes a plurality of pixels PX in the light receiver DP. The plurality of pixels PX are arranged, for example, in a matrix expanding in the first and second directions on a semiconductor substrate. In other words, the plurality of pixels PX are arranged two dimensionally.

Each of the plurality of pixels includes at least one photomultiplier element. As a photomultiplier element, for example, a single-photon avalanche diode is used. Hereinafter, a single-photon avalanche diode is referred to as a "SPAD", and a circuit for using the SPAD is referred to as a "SPAD unit SU". Functions of the SPAD will be described in detail later. In a case where a plurality of SPAD units SU are provided in a pixel PX, the plurality of SPAD units SU are arranged, for example, in a matrix expanding in the first and second directions. A pixel PX including a plurality of SPAD units SU may be called a "silicon photomultiplier (SiPM)".

Note that the number of each of the pixels PX included in the light detector 33 and the SPAD units SU included in the pixel PX is not limited to the number shown in FIG. 2, and can be freely designed. The planar shape of each of the pixels PX and SPAD units SU may not necessarily be a square. The shape of the pixel PX can vary according to the shape and arrangement of the SPAD units SU included in each pixel PX. For example, in each pixel PX, the number of SPAD units SU arranged in the first direction and the number of SPAD units SU arranged in the second direction may be different. The light detector 33 may use pixels PX having different shapes. The SPAD units SU may have other shapes, e.g., rectangles.

(Circuit Configuration of SPAD Unit SU)

Figure 3:
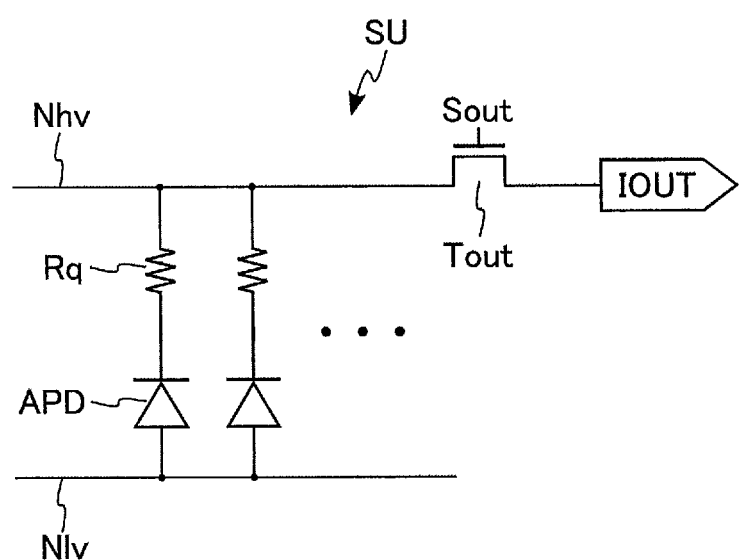
FIG. 3 depicts a circuit diagram showing an example of a circuit configuration of a SPAD unit included in the light detector according to the first embodiment.

FIG. 3 depicts an example of a circuit configuration of the SPAD unit SU included in the light detector 33 according to the first embodiment. As shown in FIG. 3, the SPAD unit SU includes, for example, an avalanche photodiode APD and a quench resistor Rq.

The avalanche photodiode APD and quench resistor Rq are coupled in series between a high voltage node Nhv and a low voltage node Nlv. Specifically, an anode of the avalanche photodiode APD is coupled to the low voltage node Nlv. A cathode of the avalanche photodiode APD is coupled to one end of the quench resistor Rq. The other end of the quench resistor Rq is coupled to the high voltage node Nhv.

In the distance measurement operation of the distance measuring device 1, a voltage applied to the high voltage node Nhv is higher than a voltage applied to the low voltage node Nlv. That is, in the distance measurement operation, a reverse bias is applied to the avalanche photodiode APD. The high voltage node Nhv corresponds to an output end of a light detection result by the avalanche photodiode APD included in the SPAD, i.e., an output node. A transistor Tout is coupled to the high voltage node Nhv. A control signal Sout is input to the gate of the transistor Tout.

The SPAD unit SU outputs an output signal IOUT corresponding to a light detection result through the transistor Tout coupled to the high voltage node Nhv. For example, if the control signal Sout is at a level "H", the SPAD unit SU outputs the output signal IOUT based on a voltage of the high voltage node Nhv through the transistor Tout. If the control signal Sout is at a level "L", the output of the output signal IOUT by the SPAD unit SU is cut off by the transistor Tout. In reality, the transistor Tout is formed by a plurality of transistors coupled in multiple stages.

In the distance measuring device 1, for example, the control signal Sout can be independently controlled for each pixel PX. That is, the distance measuring device 1 can bring the SPAD units SU included in each pixel PX into an active state or an inactive state as necessary. In the present specification, a "SPAD unit SU in an active state" indicates that the SPAD unit SU is in a state capable of detecting an optical signal and outputting an output signal IOUT. A "SPAD unit SU in an inactive state" indicates that the SPAD unit SU is in a state not outputting an output signal IOUT based on a received optical signal. Hereinafter, a pixel PX including a SPAD unit SU in an active state is referred to as a pixel PX in an ON state. A pixel PX including a SPAD unit SU in an inactive state is referred to as a pixel PX in an OFF state.

The circuit configuration of the pixel PX is not limited to the configuration described above. For example, the quench resistor Rq may be replaced with a transistor. A transistor used for quenching may be further coupled to the high voltage node Nhv. The transistor Tout may be an N-type transistor or a P-type transistor. The transistor Tout may be other switch elements as long as they are capable of selectively outputting the output signal IOUT. The arrangement of the high voltage node Nhv (output node) may be other arrangements as long as they are capable of outputting a light detection result by the avalanche photodiode APD. In addition, a plurality of SPAD units SU may form a group. If this is the case, the output signal IOUT corresponds to, for example, an electric signal corresponding to a total sum of outputs of the SPAD units SU belonging to the group.

(Operation Principle of SPAD)

Hereinafter, an example of a configuration of the avalanche photodiode APD and an operation principle of the SPAD are described with reference to FIG. 4. FIG. 4 depicts an outline of an example of a structure of the avalanche photodiode APD and an operation principle of the SPAD.

First, the configuration of the avalanche photodiode APD will be described. The avalanche photodiode APD includes, for example, a substrate 50, a P-type semiconductor layer 51, a P$^+$-type semiconductor layer 52, and an N$^+$-type semiconductor layer 53.

The substrate 50 is, for example, a P-type semiconductor substrate. On the substrate 50, the P-type semiconductor layer 51, P$^+$-type semiconductor layer 52, and N$^+$-type semiconductor layer 53 are stacked in this order. The concentration of P-type impurities in the P$^+$-type semiconductor layer 52 is higher than that of P-type impurities in the P-type semiconductor layer 51. The N$^+$-type semiconductor layer 53 is a semiconductor layer doped with N-type impurities. For example, on the N$^+$-type semiconductor layer 53, an electrode (not shown) is coupled.

Now, the operation principle of the SPAD will be described. In the distance measuring device 1 according to the first embodiment, the substrate 50 side corresponds to the low voltage node Nlv, and the N$^+$-type semiconductor layer 53 corresponds to the high voltage side (cathode).

In the distance measurement operation of the distance measuring device 1, a high voltage is applied to the avalanche photodiode APD so that the substrate 50 side is negative with respect to the N$^+$-type semiconductor layer 53. That is, a high reverse bias is applied to the avalanche photodiode APD, and a strong electric field is generated between the P$^+$-type semiconductor layer 52 and the N$^+$-type semiconductor layer 53 (FIG. 4 (1)). Accordingly, a depletion layer is formed in the vicinity of a junction (i.e., PN junction) area between the P$^+$-type semiconductor layer 52 and N$^+$-type semiconductor layer 53 (FIG. 4 (2)). In the distance measurement operation, the avalanche photodiode APD in this state corresponds to a state capable of detecting an optical signal.

Then, when the avalanche photodiode APD is irradiated with light, some energy of the light reaches the depletion layer (FIG. 4 (3)). When the depletion layer is irradiated with light, a pair of an electron and a positive hole, i.e., a carrier, may be generated in the depletion layer (FIG. 4 (4)). The carrier generated in the depletion layer drifts due to an electric field of a reverse bias applied to the avalanche photodiode APD (FIG. 4 (5)). For example, the positive hole in the generated carrier is accelerated toward the substrate 50 side. On the other hand, the electron in the generated carrier is accelerated toward the N$^+$-type semiconductor layer 53 side.

The electron accelerated toward the N$^+$-type semiconductor layer 53 side collides with an atom under a strong electric field generated in the vicinity of the PN junction. As a result, the electron that collided with the atom ionizes the atom, and generates a new pair of an electron and a positive hole. If a voltage of the reverse bias applied to the avalanche photodiode APD exceeds a breakdown voltage of the avalanche photodiode APD, such generation of a pair of an electron and a positive hole is repeated. Such a phenomenon is referred to as an avalanche breakdown (FIG. 4 (6)).

When the avalanche breakdown occurs, the avalanche photodiode APD discharges an electric current (FIG. 4 (7)). Such a discharge is referred to as a Geiger discharge. When the Geiger discharge occurs, a voltage of the output node of the SPAD unit SU increases. Thereby, an electric signal related to the Geiger discharge and the subsequent recovery is output from the avalanche photodiode APD, i.e., one SPAD.

In addition, the electric current output from the avalanche photodiode APD, for example, flows in the quench resistor Rq. As a result, a voltage drop occurs in the output node of the SPAD unit SU (FIG. 4 (8)). Such a voltage drop in the SPAD unit SU is referred to as quenching. When the voltage of the reverse bias applied to the avalanche photodiode APD drops below the breakdown voltage due to the voltage drop, the Geiger discharge is stopped. After that, when charging of the capacity at the PN junction of the avalanche photodiode APD and flowing of the recovery current are completed, the avalanche photodiode APD stops outputting the electric current. After the Geiger discharge is stopped, the avalanche photodiode APD returns to a state capable of detecting the next light beam when the current output weakens to some extent.

As described above, the light detector 33 included in the distance measuring device 1 according to the first embodiment has the avalanche photodiode APD used in a Geiger mode. Then, the avalanche photodiode APD generates an avalanche breakdown according to light incidence, and outputs an electric signal corresponding to a light detection result. Thereby, the light detector 33 can detect received light in photon units, and convert the light into an electric signal.

The structure of the avalanche photodiode APD used in the SPAD unit SU is not limited to the above-described structure. For example, the P$^+$-type semiconductor layer 52 may be omitted. The thickness of each of the P-type semiconductor layer 51, P$^+$-type semiconductor layer 52, and N$^+$-type semiconductor layer 53 can be changed as appropriate. The PN junction of the avalanche photodiode APD may be formed in the vicinity of the boundary with the substrate 50. The avalanche photodiode APD may have a structure in which the P-type semiconductor layer and N-type semiconductor layer are reversed.

(Setting of Light-Receiving Region DR)

The light detector 33 according to the first embodiment can set the light-receiving region DR by setting one or more pixels PX within a predetermined region included in the light receiver DP to an ON state. Hereinafter, an example of a method of setting the light-receiving region DR will be described.

It is assumed that a coordinate corresponding to the first direction and a coordinate corresponding to the second direction are assigned to each of a plurality of pixels provided in the light receiver DP. In the distance measurement operation of the distance measuring device 1, the entire light-receiving region DR may not necessarily be irradiated with light.

FIG. 5 depicts an example of a method of setting the light-receiving region DR in the light receiver DP included in the light detector 33 according to the first embodiment. As shown in FIG. 5, the light detector 33 according to the first embodiment sets the light-receiving region DR based on coordinates "N" and "M". "N" corresponds to a coordinate in the first direction of a pixel PX. "M" corresponds to a coordinate in the second direction of a pixel PX. These coordinates associated with the light-receiving region DR are, for example, designated based on control by the controller 11 of the emission section 10.

In addition, the coordinates "N" and "M" correspond to, for example, coordinates of an upper-left pixel within the light-receiving region DR. The present invention is not limited thereto, and the light-receiving region DR may be at least set with addresses corresponding to the coordinates "N" and "M" as a reference. For example, the coordinates of a pixel PX designated by the coordinates "N" and "M" may correspond to coordinates of any pixel PX, such as a lower-left, upper-right, lower-right, or central pixel PX, within the light-receiving region DR.

Then, the light-receiving region DR is set to a region having an expanse three pixels by four pixels in the first direction and the second direction, respectively, with the coordinates "N" and "M" as a reference. In other words, in this example, the light-receiving region DR is set to a rectangular region including 3×4 pixels. The arrangement of the pixels PX set to an ON state within the light-receiving region DR can be set as appropriate. In addition, the pixels PX within the light receiver DP and not included in the light-receiving region DR are set to an OFF state.

At least one pixel PX within the light-receiving region DR may convert the received light to an electric signal, and output an output signal IOUT corresponding to the light intensity. The output signal IOUT generated by each pixel PX is output for each pixel PX. Thereby, only a signal of a pixel PX irradiated with light is used so that noise from a pixel PX not irradiated with light is canceled and an S/N ratio (signal-to-noise ratio) increases.

The position and shape of the above-described light-receiving region DR are set according to a scanning position of laser light emitted by the distance measuring device 1. Specifically, the controller 11 of the emission section 10 designates the coordinates "N" and "M" associated with an inclination of the mirror 24 at a timing of emitting the laser light, and instructs the light detector 33 to set the light-receiving region DR. Thereby, the distance measuring device 1 can set a pixel PX within a region estimated to be irradiated with the reflected light L2 reflected from the target object TG to an ON state, and detect the reflected light L2.

(Output Part of Light Detector 33)

The light detector 33 according to the first embodiment, for example, further has a configuration of performing, prior to transferring optical signals (output signals IOUT) acquired from a plurality of pixels PX within the light-receiving region DR to the second amplifier 35, predetermined signal processing for the output signals IOUT.

Figure 6:
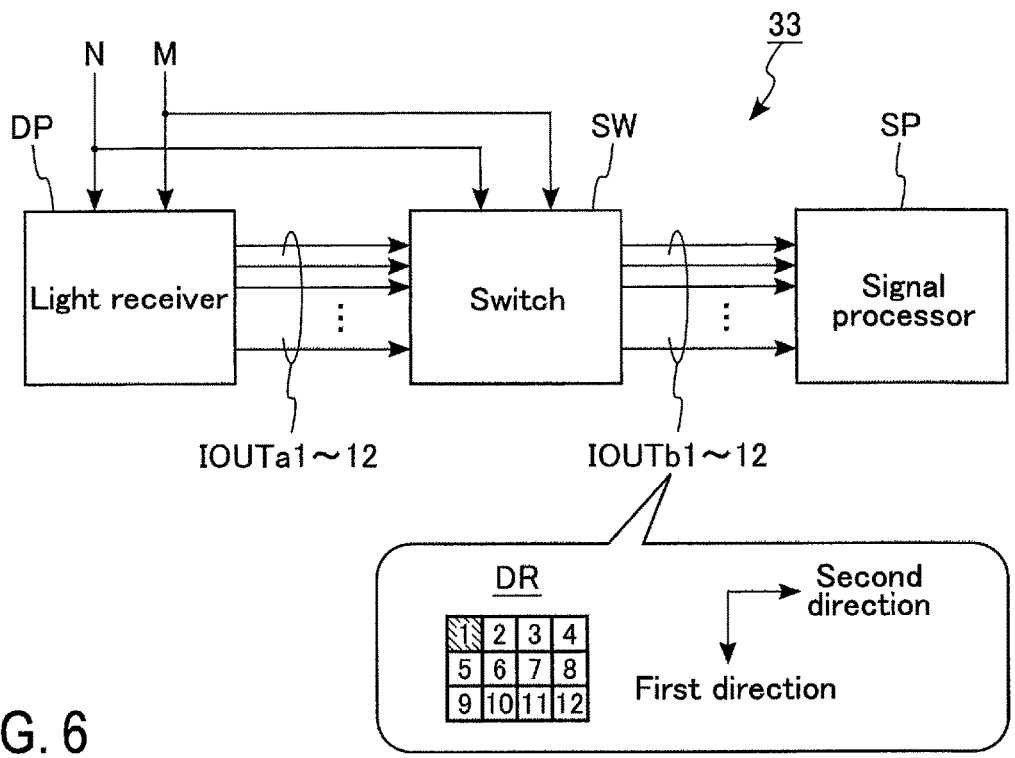
FIG. 6 depicts a block diagram showing an example of a configuration of an output part of the light detector according to the first embodiment.

FIG. 6 depicts an example of a configuration of an output part of the light detector 33 according to the first embodiment. In this example, it is assumed that a rectangular light-receiving region DR including 3×4 pixels is set. As shown in FIG. 6, the light receiver DP outputs, for example, output signals IOUTa1 to IOUTa12 respectively corresponding to twelve pixels PX. In addition, the light detector 33 further comprises, for example, a switch SW and a signal processor SP, as the output part.

The switch SW includes a plurality of switch circuits, and has a function of aligning the order of a plurality of output signals IOUT output by the light receiver DP. Specifically, to the switch SW, for example, the output signals IOUTa1 to IOUTa12 output by the light receiver DP and the coordinates "N" and "M" indicating the coordinates of the light-receiving region DR are input. Then, the switch SW aligns the output signals IOUTa1 to IOUTa12 that are input, by appropriately re-coupling a plurality of switch circuits based on the coordinates "N" and "M". After that, the switch SW outputs output signals IOUTb1 to IOUTb12 corresponding to the aligned output signals IOUTa1 to IOUTa12 to the signal processor SP. Thereby, the output order of each pixel PX within the light-receiving region DR is changed to a predetermined order (e.g., the order shown in the lower portion of FIG. 6).

The signal processor SP performs various signal processing by using the output signals IOUTb1 to IOUTb12 that are input from the switch SW. The signal processor SP can include, for example, an analog circuit like an amplifier circuit, an analog-to-digital converter, a time-to-digital converter, and a logic circuit like an adder. By the signal processing by the signal processor SP, for example, an electric signal corresponding to the light intensity for each pixel PX and an electric signal corresponding to the light intensity of a plurality of pixels PX that are grouped are generated. Then, each generated electric signal is, for example, output to the second amplifier 35 at a subsequent stage.

As described above, the output part of the light detector 33 can perform the signal processing without changing the order of relative positions within the light-receiving region DR. Such a configuration of the output part can reduce the number of signal lines used for output of the pixels PX.

(Configuration Example of Signal Processor SP)

Figure 7:
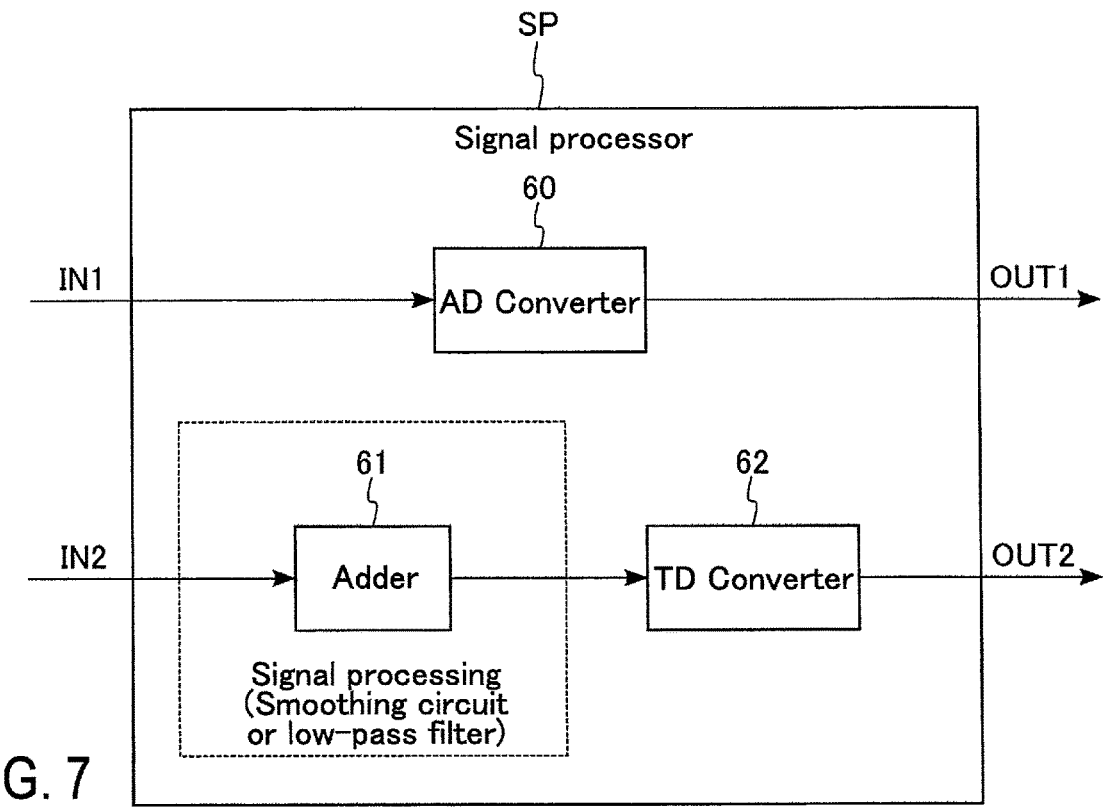
FIG. 7 depicts a block diagram showing an example of a configuration of a signal processor included in the output part of the light detector according to the first embodiment.

FIG. 7 depicts an example of a configuration of the signal processor SP included in the output part of the light detector 33 according to the first embodiment. As shown in FIG. 7, the signal processor SP includes, for example, an AD converter (ADC: Analog to Digital Converter) 60, an adder 61, and a TD converter (TDC: Time to Digital Converter) 62. These signal processors may be included in the time acquisition part 36, not in the light detector 33.

The ADC 60 converts an input analog electric signal into a digital electric signal. To the ADC 60, one type of signal IN1 corresponding to any one of the output signals IOUTb1 to IOUTb12 is input. Then, the ADC 60 outputs an output signal OUT1 based on the signal IN1 to a circuit (e.g., the second amplifier 35) at a subsequent stage.

The adder 61 integrates a plurality of input analog electric signals. To the adder 61, a plurality of types of signals IN2 corresponding to any of the output signals IOUTb1 to IOUTb12 are input. Then, the adder 61 outputs a signal obtained by integrating the plurality of types of signals IN2 to the TDC 62. In a case where the electric signals are electric currents, the adder 61 may merely connect the signal lines.

The TDC 62 performs comparison with a threshold at a predetermined interval for the analog electric signal input by the adder 61. Then, the TDC 62 outputs a digital electric signal (output signal OUT2) of a time (a difference between a time at which a light intensity exceeds the threshold and a reference time) based on a result of the comparison to a circuit (e.g., the second amplifier 35) at a subsequent state. The time resolution of the TDC 62 is generally higher than that of the ADC 60. For the threshold, there are a case of detecting a rising signal and a case of detecting a falling signal. A time at which a signal exceeds a certain threshold is detected in the former, and a time at which a signal falls below a certain threshold is detected in the latter. The case of detecting a rising signal is common, but there also is a method using a weighted average of a rise time and a fall time.

The signal processor SP may include a plurality of ADCs, or one or more ADCs may perform analog-to-digital conversion processing successively. In addition, the signal processor SP may include a plurality of sets of the adder 61 and TDC 62, or one or more TDCs 62 may perform time-to-digital conversion processing successively.

Figure 8:
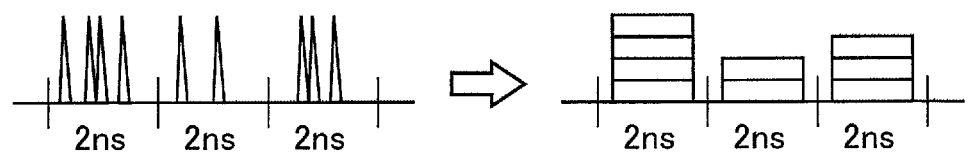
FIG. 8 depicts a schematic diagram showing an example of a signal processing method in the light detector according to the first embodiment.

FIG. 8 depicts an example of a signal processing method in the light detector 33 according to the first embodiment. The left side of FIG. 8 corresponds to an example of pulse signals to be input to the adder 61 for each unit of time, and the right side of FIG. 8 corresponds to an example of optical signals after being processed by the adder 61. Here, a high-speed SPAD with an extremely short recovery time is assumed. In addition, in general, it is effective when inputs of a plurality of SPADs are connected.

As shown in FIG. 8, the adder 61 calculates the strength of optical signals detected by the light detector 33 by counting the number of received pulse signals, for example, for each period of 2 ns. That is, the adder 61 integrates the number of detected pulse signals, for example, within the period of 2 ns, and outputs an integration result to the TDC 62. Then, the output of the adder 61 is reset after the integration result is output, and the adder 61 executes the same operation repeatedly. Thereby, the TDC 62 can output an analog signal of the light intensity based on the number of pulse signals per unit time. In other words, the TDC 62 can convert a signal input from the adder 61 to a multi-value analog signal.

Figure 9:
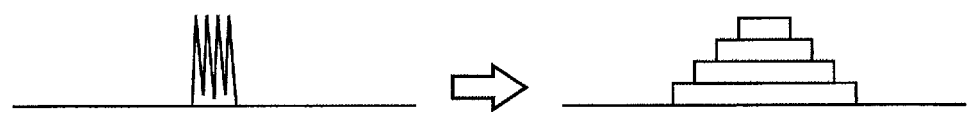
FIG. 9 depicts a schematic diagram showing an example of a signal processing method in the light detector according to the first embodiment.

FIG. 9 depicts another example of a signal processing method in the light detector according to the first embodiment, corresponding to a case where the adder 61 is replaced with a low-pass filter. The left side of FIG. 9 corresponds to an example of pulse signals to be input to the low-pass filter, and the right side of FIG. 9 corresponds to an example of an optical signal after being processed by the low-pass filter.

As shown in FIG. 9, it is possible to perform processing approximately similar to integration by the low-pass filter. The low-pass filter is formed by, for example, a capacitor and a resistor. The low-pass filter may be either an analog circuit or a digital circuit, and may be implemented by an IIR circuit or an FIR circuit. If the adder 61 is a low-pass filter, for example, the reset process described using FIG. 8 is not performed.

Note that the adder 61 may be either an analog circuit or a digital circuit. The adder 61 may be a counter counting the pulse signals which are reset at a predetermined time interval. The signal IN1 may be amplified through an amplifier prior to being input to the ADC 60. The signal IN2 may be amplified through an amplifier prior to being input to the adder 61. A smoothing circuit may be inserted between the adder 61 and the TDC 62. The ADC may be inserted between the TDC 62 and the second amplifier 35 at a subsequent stage.

In addition, the switch SW and signal processor SP may be provided integrally. The second amplifier 35 may be included in the signal processor SP. The light receiver DP and the signal processor SP may be formed on different substrates. A total sum of signal paths including the ADC and signal paths including the TDC is designed based on the number of output paths of the light receiver DP. In a case where a low-pass filter is used, the low-pass filter may be provided on the same substrate as the light detector 33 or provided outside the light detector 33.

[1-2] Operation

Hereinafter, the operation of the distance measuring device 1 according to the first embodiment will be described. The distance measuring device 1 according to the first embodiment uses a non-coaxial optical system. Thus, in the light receiver DP, deviation, i.e., parallax, can occur between a position irradiated with reflected light from a short-distance target object TG and a position irradiated with reflected light from a long-distance target object TG. First, generation of parallax of reflected light will be briefly described.

[1-2-1] Scanning Method

Figure 10:
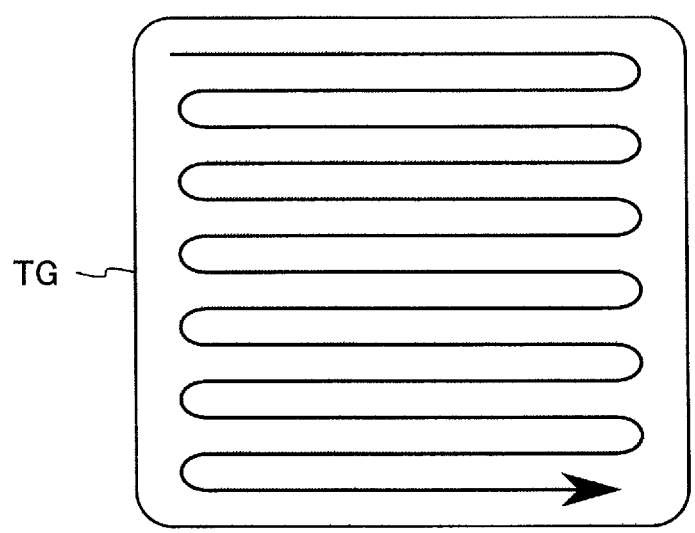
FIG. 10 depicts a schematic diagram showing an example of a scanning method of laser light in the distance measuring device according to the first embodiment.

First, an example of a scanning method of the laser light L1 in the distance measuring device 1 according to the first embodiment will be described. FIGS. 10 to 12 depict an example of an irradiation method of the laser light L1 to the target object TG, exemplifying mutually different scanning methods.

In an example shown in FIG. 10, the distance measuring device 1 scans in the right direction of the paper surface and then turns back to scan in the left direction, and scans in the left direction of the paper surface and then turns back again to scan in the right direction. The distance measuring device 1 repeatedly performs such scanning in the right and left directions. As a means for realizing such scanning, for example, it is conceivable to use a biaxial mirror.

In an example shown in FIG. 11, the distance measuring device 1 irradiates a plurality of pixels in a longitudinal line at the same time by using a laser light source having an irradiation surface in a long and thin shape in the longitudinal direction, and/or an anisotropic aspherical collimator lens. As a means for realizing such scanning, for example, it is conceivable to use a revolving mirror or a single-axis mirror. In addition, the distance measuring device 1 itself may be rotated without using a mirror.

In an example shown in FIG. 12, the distance measuring device 1 irradiates a plurality of pixels in a longitudinal line at the same time by using a laser light source having an irradiation surface in a long and thin shape in the longitudinal direction, and/or an anisotropic aspherical collimator lens, and repeatedly performs scanning shifted in the perpendicular direction multiple times. Examples of the means for realizing such scanning include a polygon mirror having different tilt angles, a revolving mirror, a biaxial mirror, etc.

The above-exemplified scanning methods are mechanical. As another scanning method, an OPA (Optical Phased Array) method is known. The effect provided by the distance measuring device 1 according to the first embodiment does not depend on a method of scanning light. Thus, the distance measuring device 1 according to the first embodiment may perform scanning of the laser light L1 by using any one of the mechanical methods and the OPA method. Hereinafter, to simplify the description, a case where the distance measuring device 1 performs scanning of the laser light L1 by using the method shown in FIG. 10 will be described.

[1-2-2] Positional Deviation of Reflected Light

FIG. 13 depicts an example of parallax of reflected light in a distance measuring device of a non-coaxial optical system, showing the light source 15, lenses 21 and 32, and light detector 33 within the distance measuring device 1, and a long-distance target object TGf and a short-distance target object TGn.

As shown in FIG. 13, the laser light L1 emitted from the light source 15 is applied to the target object TGf or TGn through the lens 21, and the reflected light L2 (reflected light) reflected from the target object TGf or TGn is applied to the light detector 33 through the lens 32. Hereinafter, the laser light reflected from the long-distance target object TGf may be referred to as "L2$f$", and the laser light reflected from the short-distance target object TGn may be referred to as "L2$n$".

The light-receiving region DR of the light detector 33 is set, for example, to synchronize in accordance with the state of the mirror 24 and the position of the reflected light from the long-distance target object TGf. However, when the non-coaxial optical system is used, a parallax of the reflected light may be generated according to the distance between the distance measuring device 1 and the target object TG. Such a parallax is generated in the direction away from the optical axis of the outgoing light. In addition, the parallax increases as the target object TG approaches.

Thus, the light-receiving region DR cannot receive the reflected light L2$n$ reflected from the short-distance target object TGn at the central portion of the light-receiving region DR even if it can receive the reflected light L2$f$ reflected from the long-distance target object TGf. That is, an intensity of the reflected light L2 applied to a plurality of pixels PX within the light-receiving region DR may be biased.

In addition, the reflected light L2 reflected from the short-distance target object TGn has a short flight distance and a small energy decrement. Thus, in the pixel PX receiving the reflected light L2$n$, a detected optical signal is saturated due to a shortage of a dynamic range, and calculation of a peak of the light intensity may be difficult.

In contrast, the distance measuring device 1 according to the first embodiment sets a light-receiving region for short distance and a light-receiving region for long distance in the light-receiving region DR of the light detector 33 in the distance measurement operation. Then, the distance measuring device 1 according to the first embodiment uses the ADC 60 for the light-receiving region for short distance and the TDC 62 for the light-receiving region for long distance. In the following descriptions, a light-receiving region for which the ADC 60 is used is referred to as an ADC region AR, and a light-receiving region for which the TDC 62 is used is referred to as a TDC region TR.

[1-2-3] Setting of Light-Receiving Region DR including TDC Region TR

FIG. 14 depicts an example of a setting method of the light-receiving region DR of the light detector 33 in the distance measurement operation of the distance measuring device 1 according to the first embodiment, showing an outgoing light and an optical axis of the outgoing light of the distance measuring device 1, and the light receiver DP of the light detector 33. As shown in FIG. 14, when the coordinates "N" and "M" are designated, the light detector 33 according to the first embodiment sets the light-receiving region DR including an ADC region AR and TDC regions TR1 and TR2.

In the present specification, a "pixel" corresponds to a region including at least one SPAD unit SU. In addition, a "pixel PX" corresponds to the minimum unit of a pixel. In the light detector 33, a plurality of pixels PX may be combined (e.g., a plurality of pixels PX may be connected) so as to form one large pixel. In the light detector 33 according to the first embodiment, pixels having different sizes can be set between the ADC region AR and the TDC regions TR.

The ADC region AR is set to, for example, a rectangular region including 3×3 pixels PX. Each of the TDC regions TR1 and TR2 is set to, for example, a rectangular region including 1×3 pixels PX. The TDC regions TR1 and TR2 sandwich the ADC region AR in the second direction. In other words, the TDC region TR1, ADC region AR, and TDC region TR2 are close to the optical axis of the outgoing light in this order. The width of the ADC region AR in the second direction is preferably set to be greater than that of each of the TDC regions TR1 and TR2 in the second direction. Each of the TDC regions TR1 and TR2 and the ADC region AR may not necessarily be adjacent.

The ADC region AR is a region mainly for detecting the reflected light (reflected light L2$f$) from the long-distance target object TGf. The ADC region AR is preferably arranged so that the reflected light L2$f$ is incident on the vicinity of the center of the ADC region AR. A plurality of pixels PX set to an ON state within the ADC region AR are output individually. Then, analog-to-digital conversion processing is performed by the ADC 60 on an output signal IOUT of each of the plurality of pixels PX in the ADC region AR.

Each of the TDC regions TR1 and TR2 is a region mainly for detecting the reflected light (reflected light L2$n$) from the short-distance target object TGn. That is, the TDC regions TR are set so as to be able to detect the reflected light L2$n$ influenced by defocusing and parallax. Output signals IOUT of a plurality of pixels PX set to an ON state within the TDC region TR1 are, for example, connected so as to be added and output. Similarly, a plurality of pixels PX set to an ON state within the TDC region TR2 are, for example, connected so as to be added and output.

That is, each of the TDC regions TR1 and TR2 is deemed to have one large pixel formed by 1×3 pixels PX. The number of SPAD units SU included in the pixel of each of the TDC regions TR1 and TR2 is greater than the number of SPAD units SU included in the pixel PX of the ADC region AR. Then, time-to-digital conversion processing is performed by the TDC 62 on each of the output signal IOUT of the pixel in the TDC region TR1 and the output signal IOUT of the pixel in the TDC region TR2.

[1-2-4] Specific Example of Reflected Light in Distance Measurement Operation

Figure 15:
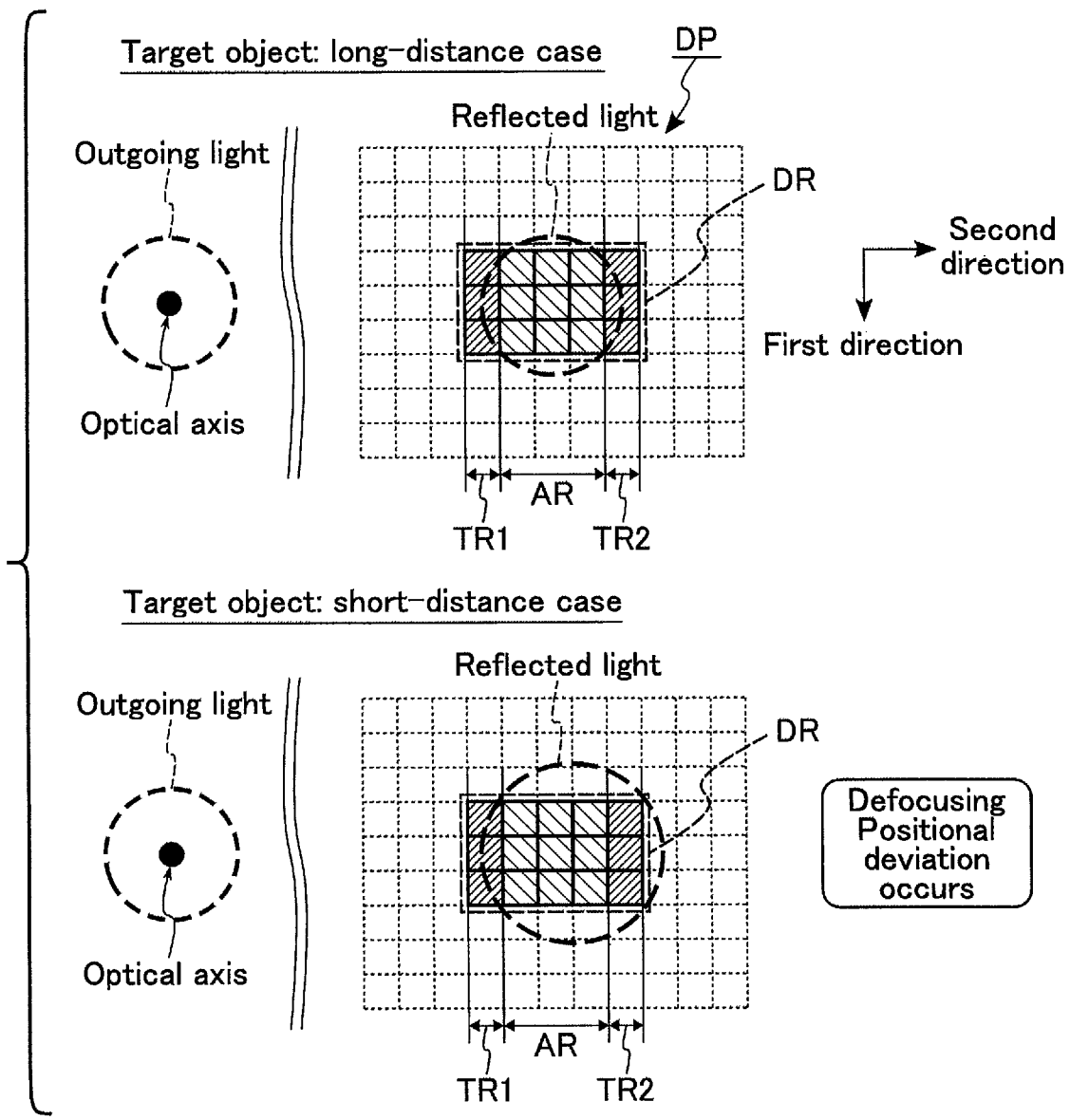
FIG. 15 depicts a plan view showing an example of a shape of incident light applied to the light detector in the distance measurement operation of the distance measuring device according to the first embodiment.

FIG. 15 depicts a specific example of reflected light applied to the light detector 33 in the distance measurement operation of the distance measuring device 1 according to the first embodiment, showing a light receiver DP similar to that shown in FIG. 14. In addition, the upper side of FIG. 15 corresponds to an example of the shape of the reflected light from the long-distance target object TGf, and the lower side of FIG. 15 corresponds to an example of the shape of the reflected light from the short-distance target object TGn.

As shown on the upper side of FIG. 15, the reflected light (reflected light L2f) from the long-distance target object TGf is mainly applied to the vicinity of the center of the ADC region AR. On the other hand, as shown on the lower side of FIG. 15, in the reflected light (reflected light L2n) from the short-distance target object TGn, deviation (parallax) of an irradiation position of the reflected light may be generated, as described using FIG. 13.

In addition, a focal point of the optical system (e.g., the lens 32, etc.) on the light-receiving side of the distance measuring device 1 is, for example, infinity, i.e., set with the long-distance target object TGf as a reference. Thus, in the reflected light from the short-distance target object TGn, defocusing may be more likely to occur than in the reflected light from the long-distance target object TGf. As a result, light expanded due to defocusing is also applied to the entire TDC region TR2. The light intensity of the reflected light increases with decreasing distance from the target object TG, and decreases with increasing distance from the target object TG. In addition, the light intensity of the reflected light per unit area decreases as defocusing occurs.

(Example of Received Light Waveform for Long-Distance Target Object TGf)

Figure 16:
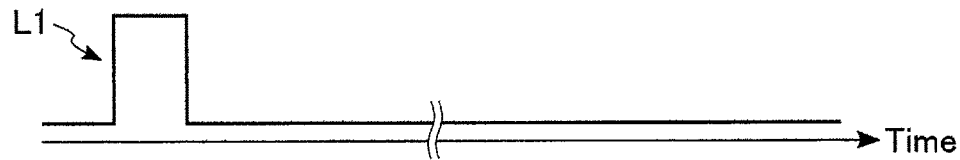
FIG. 16 depicts a light intensity distribution diagram showing an example of a measurement result in a case where a long-distance target object is detected in the distance measurement operation of the distance measuring device according to the first embodiment.
Figure 16:
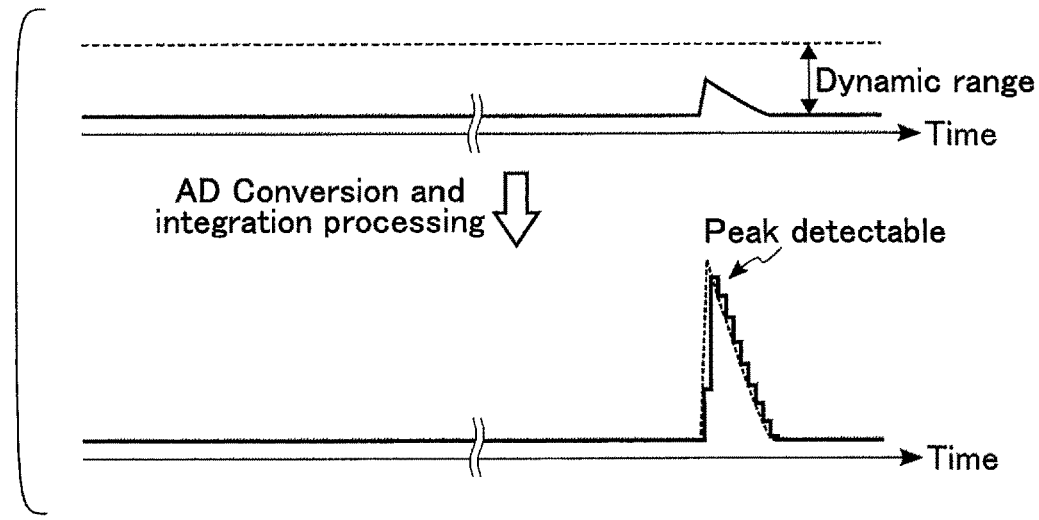
Figure 16:
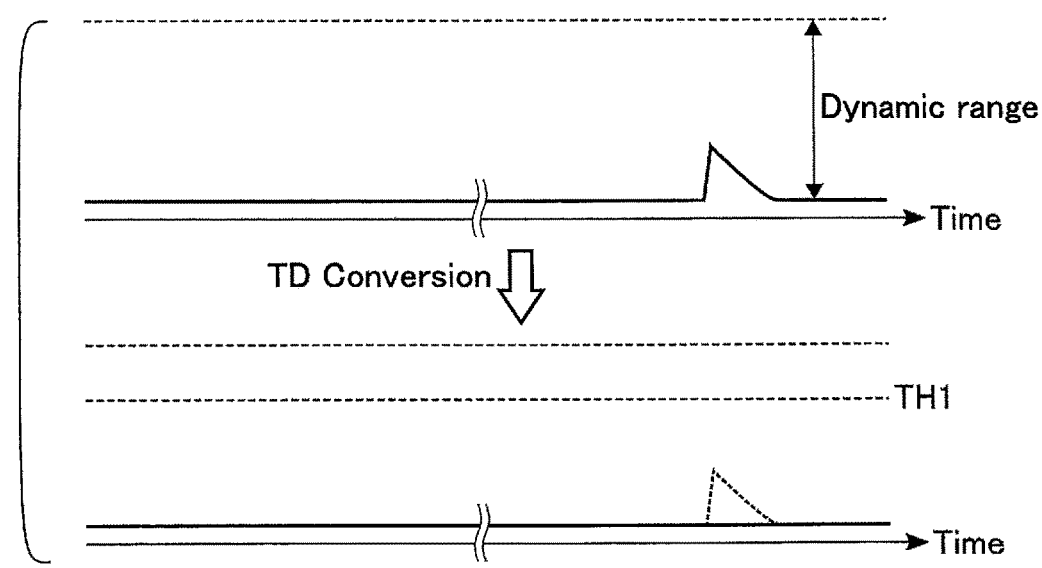

FIG. 16 depicts an example of a measurement result (light intensity distribution) in a case of detecting the long-distance target object TGf in the distance measurement operation of the distance measuring device 1 according to the first embodiment. In addition, FIG. 16 shows a waveform of an outgoing signal (outgoing light), a received light waveform in the ADC region AR, and a received light waveform in the TDC region TR.

As shown in FIG. 16, the distance measuring device 1 emits the laser light L1 by using the emission section 10 and optical system 20. The illustrated laser light L1 corresponds to one of the laser lights L1 emitted intermittently. When a certain time passes after the laser light L1 is emitted, the light detector 33 within the measurement processing section 30 receives the reflected light from the long-distance target object TGf. At this time, the reflected light is, for example, detected by each of the ADC region AR and TDC region TR.

On the reflected light detected in the ADC region AR, integration processing and AD conversion processing using output signals IOUT of a plurality of pixels PX are performed. The time acquisition part 36 can detect a peak from a received light waveform obtained by this integration processing (averaging processing) at a better S/N ratio. For example, distance measurement of an object at a longer distance becomes possible.

On the other hand, in the TDC region TR, output signals IOUT using more SPADs than the ADC region AR are obtained. Thus, a dynamic range in the TDC region TR is wider than that in the ADC region AR. When the TD conversion processing is performed on the reflected light detected in the TDC region TR, a pulse signal based on the detected reflected light is obtained. In this example, a case is indicated where a threshold TH1 of the TDC 62 is set higher, and a pulse signal is not generated by the TD conversion processing.

As described above, the distance measuring device 1 according to the first embodiment can detect a peak from the light intensity distribution acquired from the ADC region AR in the signal processing on the reflected light of the long-distance target object TGf. In this case, based on the peak acquired from the ADC region AR, the time acquisition part 36 and distance measurement processor 37 can measure the distance between the distance measuring device 1 and the target object TGf.

(Example of Received Light Waveform for Short-Distance Target Object TGn)

Figure 17:
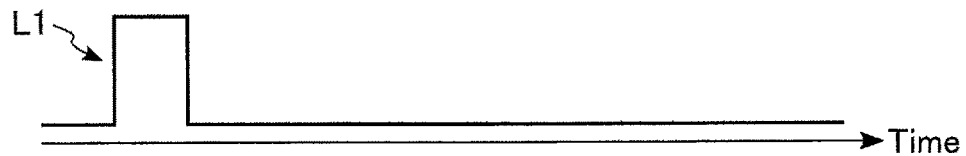
FIG. 17 depicts a light intensity distribution diagram showing an example of a measurement result in a case where a short-distance target object is detected in the distance measurement operation of the distance measuring device according to the first embodiment.
Figure 17:
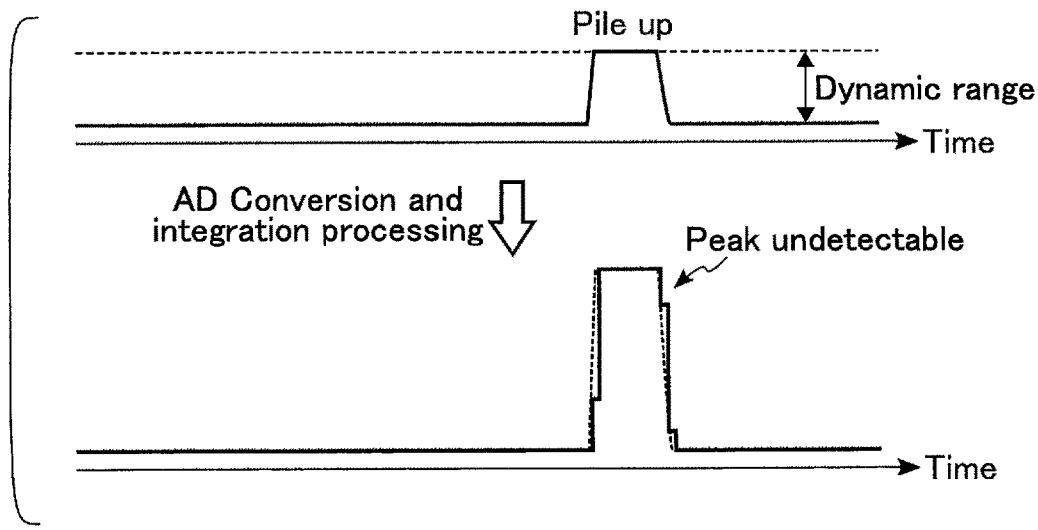
Figure 17:
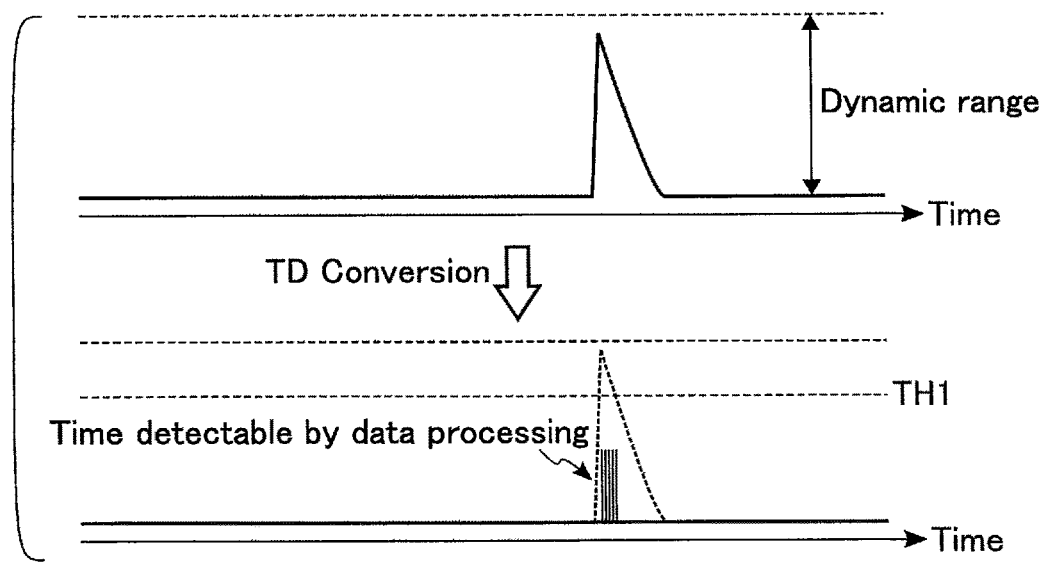

FIG. 17 depicts an example of a measurement result (light intensity distribution) in a case of detecting the short-distance target object TGn in the distance measurement operation of the distance measuring device 1 according to the first embodiment. As shown in FIG. 17, the distance measuring device 1 emits the laser light L1 in the same manner as described in FIG. 16, and the light detector 33 within the measurement processing section 30 receives reflected light from the short-distance target object TGn.

The intensity of the reflected light detected in the ADC region AR exceeds the dynamic range, and the received light waveform is saturated (piled up). In this case, even if received light waveforms of a plurality of pixels PX through the AD conversion are integrated, a peak is not seen. Thus, the time acquisition part 36 cannot detect a peak from the received light waveform obtained by the integration processing.

On the other hand, the TDC determines the time at a time at which a light intensity exceeds the threshold, not a time of a peak, and thus can measure the distance even in a case where the pile-up occurs. However, since the TDC requires a large dynamic range, it is difficult to measure the distance in a case where the number of SPADs per pixel is small as in the pixels PX of the ADC region AR. On the other hand, the pixel of the TDC region TR includes more SPADs than the pixel PX within the ADC region AR, and has a wide dynamic range. Thus, the pixel of the TDC region TR can receive the reflected light from the short-distance target object TGn. Then, when the TD conversion processing is performed on the reflected light detected in the TDC region TR, a distance is obtained from a time based on the detected reflected light and its result. In this example, since a portion exceeding the threshold TH1 exists, a pulse signal is generated at the portion where the received light waveform exceeds the threshold TH1.

As described above, the distance measuring device 1 according to the first embodiment can detect an arrival time of the reflected light acquired from the TDC region TR in the signal processing on the reflected light of the short-distance target object TGn. In this case, based on the time acquired from the TDC region TR, the time acquisition part 36 and distance measurement processor 37 can measure the distance between the distance measuring device 1 and the target object TGn.

In a case where times are detected in both of the ADC region AR and TDC region TR, the distance measuring device 1 according to the first embodiment, for example, performs distance measurement by using the time detected in the TDC region TR. This is because the TDC has a higher time resolution than the ADC, and can obtain a more accurate measurement result.

(Example of Reception Result Including Noise)

FIG. 18 depicts another example of an analyzing method of a measurement result in a case of detecting the short-distance target object TGn in the distance measurement operation of the distance measuring device 1 according to the first embodiment. In addition, FIG. 18 shows a waveform of a light reception result of reflected light detected in the ADC region AR, and a waveform of a light reception result of reflected light detected in the TDC region TR.

As shown in FIG. 18, in this example, noise is detected in each of the light reception result in the ADC region AR and the light reception result in the TDC region TR. In such a case, the measurement processing section 30 first detects a distance range in the ADC region AR. In the present specification, a "distance range" corresponds to a period in which a period of time during which the light intensity exceeds a predetermined threshold TH2 exceeds a predetermined time, in a light intensity distribution corresponding to the light reception result in the ADC region AR. Other than that, a period in which a light intensity exceeds a half of a peak value may be detected as the distance range. In addition, as a threshold used for detecting the distance range, a predetermined proportion may be used instead of a half of a peak value.

After detecting the distance range, the measurement processing section 30 detects a plurality of times at which a light intensity exceeds the threshold included in the distance range from the light reception result in the TDC region TR. In this example, the light reception result in the TDC region TR includes two times. In this way, in a case where a plurality of times are included in the distance range, the measurement processing section 30 selects a peak with the highest light intensity in the ADC region AR of the same times to use for distance measurement. Regarding the result of the ADC region AR, interpolation may be performed so that the light intensity may be calculated (about a discretionary time) with a higher resolution than a sampling time.

In general, the TDC can perform distance measurement with a higher time accuracy than the ADC, and can improve the distance accuracy by the first embodiment. Furthermore, in a case where a peak cannot be detected due to saturation generated in the light reception result in the ADC region AR and a plurality of peaks are detected from the light reception result in the TDC region TR, the distance measuring device 1 according to the first embodiment can select an appropriate peak to be used for distance measurement.

Note that the above-described method for selecting a peak is only an example. For example, in a case where a plurality of distance ranges are included, the measurement processing section 30 may selectively use the longest distance range as a criterion for selecting a time in the light reception result in the TDC region TR. The distance measurement section 30 may eliminate data of reflected light presumed to be stray light, a mirror surface, etc., prior to selecting the time of the light reception result in the TDC region TR.

[1-3] Effect of First Embodiment

LiDAR (Light Detection and Ranging) as a type of a distance measuring system irradiates an object to be measured with a laser, senses the intensity of reflected light reflected from the object to be measured by a sensor, and measures a time at which the reflected light returns based on an output from the sensor. Then, a distance between the LiDAR and the object to be measured is calculated based on, for example, a time difference between the laser emission and the return of the sensed reflected light. Since measurement data of the LiDAR is expected to be used for, for example, control of a vehicle, high accuracy is required.

To manufacture the LiDAR at a low cost, the configuration should preferably be as simple as possible. As a method for suppressing the cost, it is conceivable to suppress the cost of the optical system by a combination of a non-coaxial optical system and a 2D sensor. A 2D sensor synchronizes with scanning of the light emitter system, and changes the position of the light-receiving region. The synchronization accuracy of the light emitter system and light-receiving region can be relaxed by the 2D sensor detecting light by using a plurality of pixels rather than just one pixel. In addition, in the 2D sensor, influence due to deviation of the light-receiving position can be suppressed by providing a wide light-receiving region. On the other hand, providing a wide light-receiving region reduces a spatial resolution, and leads to an increase in power consumption. Since power consumption is preferably suppressed as much as possible, the light-receiving region is preferably set to the minimum range.

However, when the non-coaxial optical system is used, a parallax occurs according to the position of an object to be measured. In addition, a 2D sensor normally uses settings focusing on a long-distance target object. Thus, in reflected light from a short-distance target object, defocusing may occur. When defocusing occurs, a region in which the reflected light is applied to the 2D sensor becomes large. Furthermore, the intensity of the reflected light from the short-distance target object is higher than that of reflected light from the long-distance target object. Thus, in the 2D sensor, an output signal of a pixel PX by the reflected light from the short-distance target object may be saturated due to a shortage of a dynamic range. As a result, a peak of the light intensity distribution received by the 2D sensor will not be able to be detected, and this may cause difficulty in distance measurement.

Accordingly, the distance measuring device 1 according to the first embodiment provides the light detector 33 with the ADC region AR intended for the long-distance target object TGf and the TDC region TR intended for the short-distance target object TGn. Then, the distance measuring device 1 detects reflected light by performing integration processing or averaging processing on the light reception result in the ADC region AR. Furthermore, the distance measuring device 1 sets the size of the pixel in the TDC region TR larger than that of the ADC region AR. That is, in the TDC region TR, the number of SPADs corresponding to the output signals to be processed by the signal processor SP is larger than in the ADC region AR. Thus, a dynamic range of the pixel PX within the TDC region TR is wider than that of the pixel PX within the ADC region AR.

Thereby, the distance measuring device 1 according to the first embodiment can detect a peak of the reflected light by the short-distance target object TGn. Then, the distance measuring device 1 according to the first embodiment uses the TDC 62 with a high time resolution, and thus can accurately measure the distance between itself and the short-distance target object TGn.

In the first embodiment, depending on setting of a threshold, the TDC 62 may have difficulty in distinguishing between noise and a light reception result of reflected light. In a case where a low threshold is used in the TDC 62, a false detection may occur due to noise. Since the false detection may, for example, lead to an accident when the device is mounted on a vehicle, the threshold of the TDC 62 may be preferably set so as to exceed the noise. To set the threshold appropriately and use the TDC 62, the pixel needs to have a relatively large number of SPADs.

In contrast, in the distance measuring device 1 according to the first embodiment, as described above, the number of SPADs of the pixel within the TDC region TR is set to be greater than that of the pixel within the ADC region AR. As a result, in the distance measuring device 1 according to the first embodiment, the dynamic range of the pixel in the TDC region TR becomes wide, and this makes it possible to set an appropriate threshold in use of the TDC 62. Therefore, the distance measuring device 1 according to the first embodiment can suppress occurrence of a false detection.

In addition, the distance measuring device 1 according to the first embodiment can also select a peak to be used for distance measurement in the TDC region TR by using a light reception result in the ADC region AR. That is, during a period (hereinafter, referred to as a distance range) during which the light intensity is large in the light reception result in the ADC region AR, there is a high probability of receiving reflected light. Thus, the distance measuring device 1 extracts a signal corresponding to the distance range from the light reception result in the TDC region TR.

Thereby, the distance measuring device 1 according to the first embodiment can eliminate noise components from distance measurement time candidates when searching for a peak from the light reception result in the TDC region TR. Furthermore, the distance measuring device 1 according to the first embodiment, in a case where a plurality of distance measurement times are detected in the distance range, selects a distance measurement time with a higher light intensity so as to be able to further improve the distance measurement accuracy.

In the distance measuring device 1 according to the first embodiment as described above, the light reception result in the TDC region TR may be used for correction of a scanning position. For example, in a case where it is detected that there is a bias in the received light intensity between the TDC region TR1 and TDC region TR2, the distance measuring device 1 may correct the scanning position so that the bias is suppressed.

In addition, in the distance measuring device 1 according to the first embodiment, output coupling (current addition) may be applied to addition of the output signals IOUT in the TDC region TR. In this case, a plurality of pixels PX within the TDC region TR are added at the time of being output from the light-receiving region DR, and the adder 61 within the signal processor SP is omitted. Then, the distance measuring device 1 can share a pin of a chip output corresponding to each of the TDC regions TR1 and TR2, and suppress the number of pins. In addition, by not outputting data with a low accuracy, the distance measuring device 1 can reduce a bandwidth of the output and reduce the number of output pins.

[2] Second Embodiment

A distance measuring device 1 according to a second embodiment has the same configuration as that of the first embodiment, and pulsed light in a shape extending in the first direction is used in the distance measurement operation. In the following, points different from the first embodiment will be described regarding the distance measuring device 1 according to the second embodiment.

[2-1] Operation of Light Detector 33

FIG. 19 depicts an example of a setting method of the light-receiving region DR of the light detector 33 in a distance measurement operation of the distance measuring device 1 according to the second embodiment. As shown in FIG. 19, in the distance measuring device 1 according to the second embodiment, outgoing light has a shape extending in the first direction. The shape of the outgoing light in the second embodiment may have at least a portion extending in the first direction, and may be an ellipse, for example.

In addition, the light-receiving region DR in the second embodiment includes a plurality of channels CH1 to CH5. One channel CH corresponds to, for example, one measurement point for a target object TG. The channels CH1 to CH5 are arranged in the first direction. In the second embodiment, reflected light in the target object TG may be applied to each of the plurality of channels CH by using the outgoing light having the shape extending in the first direction. Thereby, the distance measuring device 1 according to the second embodiment can obtain five measurement results arranged in the first direction for one pulsed light (outgoing light) in the distance measurement operation.

The light-receiving region set for each channel CH may have the same configuration as that of the light-receiving region DR described in the first embodiment. The light detector 33 according to the second embodiment can set the light-receiving region DR including the five channels CH arranged in the first direction by the coordinates "N" and "M" being designated. The other operations of the distance measuring device 1 according to the second embodiment are the same as those of the first embodiment.

[2-2] Effect of Second Embodiment

As described above, the distance measuring device 1 according to the second embodiment can obtain a plurality of measurement results at a time by using the vertically long pulsed light and providing the plurality of channels CH in the light-receiving region DR. That is, the distance measuring device 1 according to the second embodiment can improve the speed of performing scanning for one screen, and improve a frame rate of length measurement. In addition, in the distance measuring device 1 according to the second embodiment, by setting the ADC region AR and TDC regions TR in each channel CH, the same effect as that of the first embodiment can be obtained in each channel CH.

[3] Third Embodiment

A light detector 33 according to the third embodiment has a configuration in which a circuit for performing quenching actively is added to the first embodiment. In the following, points different from the first embodiment will be described regarding a distance measuring device 1 according to the third embodiment.

[3-1] Circuit Configuration of SPAD Unit SU

The light detector 33 according to the first embodiment performs quenching by a voltage drop of the quench resistor Rq, and is in accordance with a scheme called "passive quench". On the other hand, the light detector 33 according to the third embodiment is in accordance with a method called "active quench" performing a quenching operation by an active element like a transistor. The active quench (AQ) is introduced in Zappa, et al., "Fully Integrated Active Quenching Circuit for Single Photon Detection", ESSCIRC 2002, Richardson, J, Henderson, R & Renshaw, D 2007, Dynamic Quenching for Single Photon Avalanche Diode Arrays in 2007 International Image Sensor Workshop, pp. 13.

FIG. 20 depicts an example of a circuit configuration of a SPAD unit SU included in the light detector 33 according to the third embodiment. As shown in FIG. 20, the SPAD unit SU according to the third embodiment further includes transistors TSq and TSr, a resistor Rs, an AQ (Active Quench) control circuit 70, and an OR circuit 71.

One ends of the transistors TSq and TSr may be coupled to a cathode of the avalanche photodiode APD through the resistor Rs smaller than the resistor Rq. The other end of the transistor TSq is set to a voltage that is lower than Vbd (an absolute value of a breakdown voltage of the APD) with respect to the node Nlv. The other end of the transistor TSr is coupled to the node Nhv. To the cathode of the avalanche photodiode APD, the AQ control circuit 70 is coupled through the resistor Rs.

The AQ control circuit 70 switches the transistor TSq over to ON when detecting that the avalanche photodiode APD generates an avalanche breakdown and a large electric current flows in the cathode of the avalanche photodiode APD. Thereby, the voltage of the cathode of the avalanche photodiode APD falls below a breakdown voltage, and a Geiger phenomenon converges.

Furthermore, the AQ control circuit 70 maintains the transistor TSq in an ON state for a predetermined time until the avalanche phenomenon converges. When the predetermined time has passed, the AQ control circuit 70 turns off the transistor TSq and turns on the transistor TSr. As a result, the voltage of the cathode of the avalanche photodiode APD rises rapidly above the breakdown voltage, and the avalanche photodiode APD enters a state capable of measuring a distance again.

In addition, upon detection of the large electric current flowing in the cathode of the avalanche photodiode APD, the AQ control circuit 70 generates an output current in an output node Nout for only a short time. To the output node Nout, a plurality of SPAD units SU are coupled. Then, an output signal IOUT based on a voltage of the output node Nout is output through the transistor Tout.

The OR circuit 71 is provided between the AQ control circuit 70 and the gate of the transistor TSq. Specifically, in the OR circuit 71, the AQ control circuit 70 is coupled to a first input terminal, an inversion signal/Sout of the control signal Sout is input to a second input terminal, and an output terminal is coupled to the gate of the transistor TSq. Thereby, in a case where the SPAD unit SU is not selected, the OR circuit 71 can prevent the avalanche photodiode APD from causing the avalanche phenomenon and suppress power consumption of the light detector 33.

Each of the transistors TSr and TSq may be an N-type transistor or a P-type transistor as long as it is capable of performing the above-described operations. The transistor TSq may be other switch elements or coupled to other nodes as long as it is capable of coupling the high voltage node Nhv to a low voltage.

[3-2] Distance Measurement Operation

FIG. 21 depicts an example of a detection result of a target object TG in a distance measurement operation, the upper side of which shows an example of results of the ADC and TDC in a case of using the passive quench corresponding to the first embodiment, and the lower side of which shows an example of results of the ADC and TDC in a case of using the active quench corresponding to the third embodiment.

As shown on the upper side of FIG. 21, in the case of the passive quench of the first embodiment, it may take time to recover to a state capable of detecting light after the avalanche phenomenon of the avalanche photodiode APD occurs. Specifically, when a signal displayed as "true value" is to be detected, there is a case where the recovery from the avalanche phenomenon may not be finished due to the previous signal or noise (dark noise or optical noise). In this case, there is a case where the TDC may be unable to detect the true value. Note that this TDC is assumed to detect an optical signal in a case where an input signal exceeds a threshold after falling below the threshold.

As shown on the lower side of FIG. 21, in the case of the active quench of the third embodiment, a time from occurrence of the avalanche phenomenon of the avalanche photodiode APD to recovery to a state capable of detecting light is shorter than that of the passive quench. That is, a high-speed recovery is possible in the active quench. Specifically, by the time of detecting the signal displayed as "true value", the recovery from the avalanche phenomenon due to the previous signal or noise is finished, and a time of the true value can be detected by the TDC. In a case where the detected time of the true value is included in a time range specified by the ADC, the time of the true value included in the time range is selected as the first candidate of distance value.

Figure 22:
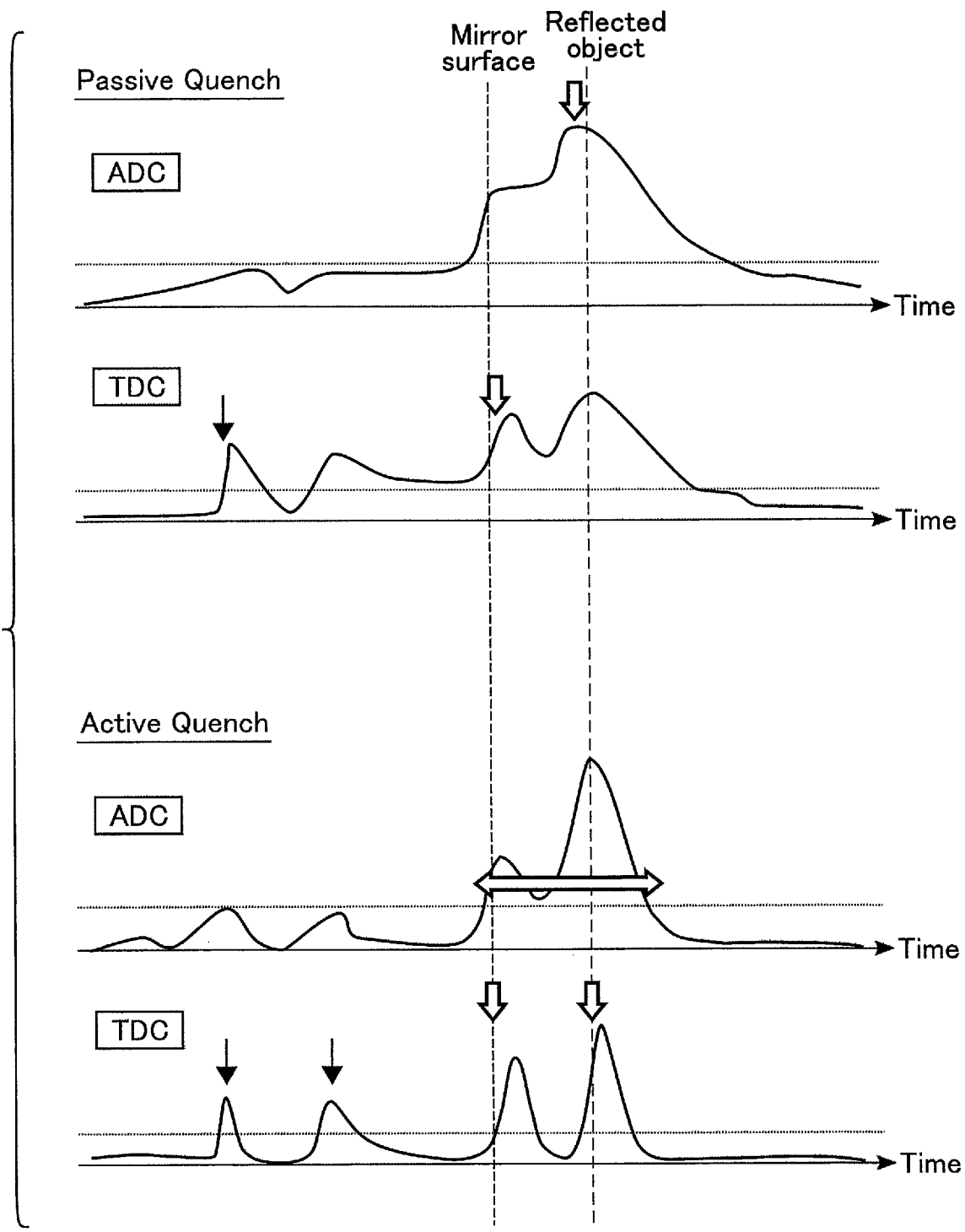
FIG. 22 depicts a light intensity distribution diagram showing an example of a measurement result in a case where a target object is detected in the distance measurement operation of the distance measuring device according to the third embodiment.

FIG. 22 depicts an example of a detection result of a target object TG in a distance measurement operation, the upper side of which shows an example of results of the ADC and TDC in a case of using the passive quench corresponding to the first embodiment, and the lower side of which shows an example of results of the ADC and TDC in a case of using the active quench corresponding to the third embodiment. In FIG. 22, these results include a signal based on reflected light from a mirror surface.

In a case of measuring a distance from an object having a mirror surface such as a metallic painted car, the light detector 33 may detect reflected light from an object (reflected object) reflected on the mirror surface in addition to the reflected light from the mirror surface. When these objects are close in distance, peaks of input signals may be integrated. For example, when the light intensity from the reflected object is higher than that of the reflected light of the mirror surface, the peak detection based on the ADC alone may overlook the light of the mirror surface.

In contrast, the light detector 33 according to the first embodiment can detect the reflected light from the mirror surface by the TDC. Although it is the most desirable to be able to detect both the mirror surface and the reflected object, in the light detector 33 according to the first embodiment, the TDC may be unable to detect a signal from the reflected object due to the influence of noise.

On the other hand, the light detector 33 according to the third embodiment can suppress remaining of noise by the active quench. As a result, the light detector 33 according to the third embodiment has a higher probability of detecting signals from the reflected object also in addition to the mirror surface than the first embodiment. The other operations of the distance measuring device 1 according to the third embodiment are the same as those of the first embodiment.

[3-3] Effect of Third Embodiment

As described above, in the distance measuring device 1 according to the third embodiment, the light detector 33 has the elements (e.g., the transistors TSq and TSr) performing quenching actively. The ON/OFF of the transistors TSq and TSr is controlled by the AQ control circuit 70 and OR circuit 71, and the control signal/Sout. Then, carriers accumulating in the node to which the cathode of the avalanche photodiode APD is coupled are forcibly discharged as appropriate by the transistor TSr.

Thereby, the distance measuring device 1 according to the third embodiment can shorten a recovery time of a SPAD receiving stray light, and detect more reliably and accurately by the TDC a time at which reflected light from a short distance arrives. That is, the distance measuring device 1 according to the third embodiment can eliminate the influence of the previous signal or noise and the mirror surface, and detect the short-distance target object TGn. Accordingly, the distance measuring device 1 according to the third embodiment can obtain the same effect as that of the first embodiment, and improve distance measurement accuracy for the short-distance target object TGn. As a result, a user who uses the distance measuring device 1 can have a better grasp of the situation.

[4] Other

FIG. 23 depicts an example of arrangement of a light emitter system and a light-receiving system in a distance measuring device 1 according to a modification of the first embodiment. The light emitter system shown in FIG. 23 corresponds to, for example, the optical system 20, and the light-receiving system corresponds to the light detector 33. As the arrangement of the light emitter system and light-receiving system in the distance measuring device 1, for example, two types (the first and second arrangement examples) shown in FIG. 23 are conceivable.

In the first arrangement example, the light emitter system emits laser light in the second direction, and the light emitter system and light-receiving system are arranged in the first direction. In this case, vertically long laser light is used as in the second embodiment so that the problem of reflected light positional deviation as described using FIG. 13 can be alleviated. In the second arrangement example, the light emitter system emits laser light in the second direction, and the light emitter system and light-receiving system are arranged in the second direction. Depending on the system of the distance measuring device 1, there is a case where the second arrangement example can suppress the manufacturing costs more than the first arrangement example. The arrangement in the modification of the first embodiment is also applicable to each of the second embodiment and third embodiment.

The above-described embodiments can be combined. For example, the second embodiment may be combined with the third embodiment. The distance measuring device 1 in which a plurality of embodiments are combined can obtain the effect of each of the combined embodiments. Various processing of the measurement processing section 30 associated with the distance measurement may be deemed as being performed by the controller 11.

The arrangement of the TDC region TR described in the first embodiment is only an example. The TDC region TR may be, for example, sandwiched by the ADC regions AR. Also in such a case, the number of the SPADs included in the pixel PX within the TDC region TR is set to be greater than that of the SPADs included in the pixel PX within the ADC region AR so that the dynamic range of the pixel PX in the TDC region TR becomes wide. That is, the distance measuring device 1 can perform distance measurement by the TDC.

In the present specification, a "pixel region" corresponds to a total of the output signals IOUT of the pixels PX input to the ADC 60 or TDC 62. For example, the size of a pixel region within the ADC region AR corresponds to the size of one pixel PX. The size of a pixel region within the TDC region TR corresponds to a total size of a plurality of pixels PX corresponding to signals input to the TDC 62. The size of the pixel may be defined by, for example, the number and arrangement of SPADs associated with signals collectively output from the light receiver DP. A "quench element" corresponds to, for example, a quench resistor, or a transistor.

In the present specification, a level "H" voltage is a voltage in which an N-type transistor enters an ON state when said voltage is applied to its gate, and a P-type transistor enters an OFF state when said voltage is applied to its gate. A level "L" voltage is a voltage in which an N-type transistor enters an OFF state when said voltage is applied to its gate, and a P-type transistor enters an ON state when said voltage is applied to its gate.

In the present specification, the term "couple/connect" refers to electrical coupling, and does not exclude intervention of, for example, another element. In the present specification, an "ON state" refers to a state in which the gate of a relevant transistor has a voltage equal to or greater than the threshold voltage of the transistor applied. An "OFF state" refers to a state in which the gate of a relevant transistor has a voltage below the threshold voltage of the transistor applied, and does not exclude, for example, the state where a minute electric current such as a leakage current in the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light detector comprising:
   a light receiver including a plurality of sensors arranged two dimensionally on a substrate; and
   a controller configured to set a light-receiving region in which the sensors are selectively turned on in the light receiver, wherein
   the controller is configured to set a first light-receiving region and a second light-receiving region different from the first light-receiving region based on information on coordinates input from outside,
   the first light-receiving region including a first pixel region and a second pixel region, each of the first pixel region and the second pixel region including at least one of the sensors, and
   the second light-receiving region including a third pixel region, an area of the third pixel region being larger than a total area of the first pixel region and the second pixel region, and
   the light receiver is configured to, when light is applied:
      cause each of the first pixel region and the second pixel region within the first light-receiving region to individually output a signal; and
      cause the third pixel region within the second light-receiving region to output signals collectively.

2. The light detector of claim 1, further comprising:
   a signal processor configured to receive a signal output from the light receiver, wherein
   the signal processor is configured to:
      perform analog-to-digital conversion processing on each of the signal output from the first pixel region and the signal output from the second pixel region; and
      perform time-to-digital conversion processing on the signals output from the third pixel region.

3. The light detector of claim 1, wherein
the controller is further configured to set a third light-receiving region different from the first light-receiving region and the second light-receiving region,
the first light-receiving region is arranged between the second light-receiving region and the third light-receiving region, the third light-receiving region including a fourth pixel region, and an area of the fourth pixel region being larger than a total area of the first pixel region and the second pixel region, and
the light receiver is configured to, when light is applied, output signals collectively from the fourth pixel region within the third light-receiving region.

4. The light detector of claim 1, wherein
each of the sensors includes an avalanche photodiode and a quench element, an anode of the avalanche photodiode coupled to a first power supply node, an end of the quench element coupled to a second power supply node, and another end of the quench element coupled to a cathode of the avalanche photodiode, and
the controller is configured to, when the sensor is turned on, apply a first voltage to the first power supply node, and apply a second voltage higher than the first voltage to the second power supply node.

5. The light detector of claim 1, wherein
each of the sensors further includes a transistor coupled to the cathode of the avalanche photodiode, and
the controller is configured to, when setting the first light-receiving region and the second light-receiving region, control the transistor to an OFF state, and after a first time period passes after the transistor is set to the OFF state, temporarily change the transistor to an ON state.

6. A distance measuring device comprising:
a light emitter configured to emit an optical signal;
a light receiver including a plurality of sensors arranged two dimensionally on a substrate;
a controller configured to set a light-receiving region in which the sensors are selectively turned on in the light receiver; and
a signal processor capable of performing analog-to-digital conversion processing and time-to-digital conversion processing, wherein
the controller is configured to set a first light-receiving region and a second light-receiving region different from the first light-receiving region based on information on coordinates input from outside,
the first light-receiving region including a first pixel region and a second pixel region, each of the first pixel region and the second pixel region including at least one of the sensors, and
the second light-receiving region including a third pixel region, an area of the third pixel region being larger than a total area of the first pixel region and the second pixel region, and
the signal processor is configured to:
perform the analog-to-digital conversion processing individually on an output of the first pixel region and an output of the second pixel region; and
perform the time-to-digital conversion processing on a signal obtained by collecting outputs of the third pixel region.

7. The distance measuring device of claim 6, wherein
the controller is configured to measure a distance between a target object reflecting the optical signal and the distance measuring device based on a first timing at which the light emitter emits the optical signal and a second timing at which the light receiver receives reflected light of the optical signal.

8. The distance measuring device of claim 7, wherein
the signal processor is configured to:
add a first electric signal obtained by performing the analog-to-digital conversion processing on the output of the first pixel region and a second electric signal obtained by performing the analog-to-digital conversion processing on the output of the second pixel region, and output a result; and
output a third electric signal obtained by performing the time-to-digital conversion processing on the outputs of the third pixel region, and generate a fourth electric signal representing a temporal change in light intensity based on the third electric signal, and
the controller is configured to detect a period in which a light intensity exceeds a first threshold from the output result of adding the first electric signal and the second electric signal, and set a time of a peak included in the period in the fourth electric signal as the second timing.

9. The distance measuring device of claim 8, wherein
the controller is configured to, when the fourth electric signal includes a plurality of peaks in the period, set a time of a strongest peak as the second timing.

10. The distance measuring device of claim 6, wherein
the light receiver is configured to, when light is applied:
cause each of the first pixel region and the second pixel region within the first light-receiving region to individually output a signal; and
cause the third pixel region within the second light-receiving region to output signals collectively.

11. The distance measuring device of claim 6, wherein
the controller is further configured to set a third light-receiving region different from the first light-receiving region and the second light-receiving region,
the first light-receiving region is arranged between the second light-receiving region and the third light-receiving region, the third light-receiving region including a fourth pixel region, and an area of the fourth pixel region being larger than a total area of the first pixel region and the second pixel region, and
the light receiver is configured to, when light is applied, output signals collectively from the fourth pixel region within the third light-receiving region.

12. The distance measuring device of claim 6, wherein
the first light-receiving region includes first and second channels arranged in a second direction intersecting a first direction in which the first light-receiving region and the second light-receiving region are adjacent to each other, and
the controller is configured to measure a first distance and a second distance between a target object and the distance measuring device based on one optical signal emitted by the light emitter and a light reception result of reflected light associated with the one optical signal received by the light receiver, the first distance and the second distance corresponding to the first channel and the second channel, respectively.

13. The distance measuring device of claim 6, wherein
each of the sensors includes an avalanche photodiode and a quench element, an anode of the avalanche photodiode coupled to a first power supply node, an end of the quench element coupled to a second power supply node, and another end of the quench element coupled to a cathode of the avalanche photodiode, and
the controller is configured to, when the sensor is turned on, apply a first voltage to the first power supply node, and apply a second voltage higher than the first voltage to the second power supply node.

14. The distance measuring device of claim 13, wherein each of the sensors further includes a transistor coupled to the cathode of the avalanche photodiode, and
the controller is configured to, when setting the first light-receiving region and the second light-receiving region, control the transistor to an OFF state, and after a first time period passes after the transistor is set to the OFF state, temporarily change the transistor to an ON state.

* * * * *